United States Patent
Fujisawa et al.

(10) Patent No.: US 7,247,950 B2
(45) Date of Patent: Jul. 24, 2007

(54) SEMICONDUCTOR DEVICE AND METHOD OF MANUFACTURING THE SAME

(75) Inventors: Tetsuya Fujisawa, Kawasaki (JP); Masamitsu Ikumo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 454 days.

(21) Appl. No.: 10/981,557

(22) Filed: Nov. 5, 2004

(65) Prior Publication Data

US 2006/0012017 A1  Jan. 19, 2006

(30) Foreign Application Priority Data

Jul. 14, 2004 (JP) .............................. 2004-207516

(51) Int. Cl.
*H01L 23/48* (2006.01)

(52) U.S. Cl. .................. 257/778; 257/723; 438/123

(58) Field of Classification Search ................ 257/723, 257/778, 678; 438/123, 124
See application file for complete search history.

(56) References Cited

FOREIGN PATENT DOCUMENTS

| JP | 2001-217381 | 8/2001 |
|---|---|---|
| JP | 2004-56093 | 2/2004 |

*Primary Examiner*—Roy Karl Potter
(74) *Attorney, Agent, or Firm*—Westerman, Hattori, Daniels & Adrian, LLP.

(57) ABSTRACT

A semiconductor device comprises a frame provided on a substrate to form a semiconductor-chip accommodating part on the substrate. A semiconductor chip is provided in the semiconductor-chip accommodating part. An organic insulating layer is provided to cover the semiconductor chip and the frame. A wiring layer is provided on the organic insulating layer. In the semiconductor device, the frame comprises gaps which are arranged in a longitudinal direction of the frame.

13 Claims, 25 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2004-207516, filed on Jul. 14, 2004, the entire contents of which are herein incorporated by reference.

BACKGROUND OF THE INVENTION

1. Field of the Invention

The present invention generally relates to a semiconductor device and method of manufacturing the same, and more particularly to a semiconductor device and method of manufacturing the same wherein one or more semiconductor chips are mounted on a substrate with high mounting density.

2. Description of the Related Art

In recent years, advanced features and miniaturization of electronic equipment are demanded, and, therefore, advanced features and miniaturization of semiconductor devices mounted on the electronic equipment are also needed simultaneously. For this reason, the technique in which many functions are given to a single semiconductor chip and one or more semiconductor chips having different functions are mounted on a carrier substrate or package is performed in order to attain multiple functions of the semiconductor chips.

The applicant of this invention has proposed in the following Japanese Patent Applications some techniques concerning semiconductor devices and manufacture methods thereof which attain multiple functions with two or more semiconductor chips mounted.

As one of them, Japanese Laid-Open Patent Application No. 2001-217381 discloses a semiconductor device and its manufacture method in which two or more semiconductor chips having different functions and arranged in proximity are provided, the reflow wiring layer which covers the semiconductor chips in common and connects the semiconductor chips mutually is formed thereon, and the electrode posts (copper) are formed on the reflow wiring layer.

Disclosed in Japanese Laid-Open Patent Application No. 2001-217381 are that the plural semiconductor chips interconnected by the reflow wiring layer are made into the integral structure, the back surfaces of the semiconductor chips are fixed onto the common carrier substrate (metal plate, etc.) to strengthen the integral structure, and the semiconductor chips with different sizes are laminated and the reflow wiring layer is formed to cover such semiconductor chips in common.

Moreover, disclosed is that the semiconductor chips and the electrode posts are mutually insulated with the resin respectively.

Moreover, FIG. 1A through FIG. 8B show a conventional semiconductor device and its manufacture method disclosed in Japanese Laid-Open Patent Application No. 2004-056093, in which two or more semiconductor chips the different functions are mounted on the substrate, and another semiconductor chip is further mounted on the semiconductor chips via the insulating layer.

In addition, each of FIGS. 1A, 2A, 3A, 4A, 5A, 6A, 7A and 8A is a plan view of the conventional semiconductor device, and each of FIGS. 1B, 2B, 3B, 4B, 5B, 6B, 7B and 8B is a cross-sectional view of the conventional semiconductor device taken along the line A-A indicated in the corresponding one of FIGS. 1A, 2A, 3A, 4A, 5A, 6A, 7A and 8A.

As shown in FIG. 1A, the first resin layer 2 is formed on the wafer 1 which is used as the carrier substrate. The first resin layer 2 is subjected to patterning in the shape of a frame and arranged so that the first component accommodating parts 3 are formed.

As shown in FIG. 2A, the first semiconductor chips 4 are respectively held in the first component accommodating parts 3.

The first semiconductor chips 4 are fixed to the wafer 1 using the adhesive agent 5. Subsequently, the first organic insulating layer 7 is formed to cover the first resin layer 2 and the first semiconductor chips 4. This state is shown in FIG. 3A. This first organic insulating layer 7 is arranged to cover both the top surface of the first resin layer 2 and the top surfaces of the first semiconductor chips 4 in common.

Subsequently, in the first organic insulating layer 7 of the 1st, the interlayer connections (vias) are formed at the positions corresponding to the pads 6 of the first semiconductor chips 4, and the first reflow wiring layer 8 is formed on the top surface of the first organic insulating layer 7. FIG. 4A shows the state where the reflow wiring layer 8 is formed.

Subsequently, as shown in FIG. 5A, the second resin layer 9 is formed on the first organic insulating layer 7 and the reflow wiring layer 8. There is provided almost in the center of the second resin layer 9 the second component accommodating part 11, and the vias 10 are formed in two rows near the second component accommodating part 11. A part of the first reflow wiring 8 formed on the first organic insulating layer 7 is exposed to the inside of the second component accommodating part 11, and the first reflow wiring 8 is exposed also to the bottom of the vias 10.

Subsequently, as shown in FIG. 6A, the second semiconductor chip 12 is held in the second component accommodating part 11. The second semiconductor chip 12 is fixed to the top surface of the first organic insulating layer 7 by the adhesive agent 5.

Subsequently, the second organic insulating layer 14 is arranged to cover the second resin layer 9 and the second semiconductor chip 12, and the second reflow wiring 15 is formed on the front surface of the second organic insulating layer 14 so that it is electrically connected to the first reflow wiring layer 8 through the vias 16 formed inside the vias 10. FIG. 7A shows the state where the second organic insulating layer 14 and the second reflow wiring 15 are arranged.

Subsequently, the covering film 17 which is made of the solder resist is formed on the second organic insulating layer 14, and the vias for arranging the external terminals 18 are formed on the covering film 17. The external terminals 18 and the second reflow wiring 15 are electrically connected together through these vias.

As shown in FIG. 8A, the semiconductor device is thus produced in which the plural semiconductor chips are accommodated in one package.

However, in the technique disclosed in Japanese Laid-Open Patent Application No. 2001-217381, the transfer molding method is used to encapsulate the two or more semiconductor chips in the resin. For this reason, a warpage may occur in the substrate (silicone) supporting the semiconductor chips at the time of curing of the resin for the encapsulation, and the occurrence of this warpage is seen more frequently when the two or more semiconductor chips are laminated on the substrate.

On the other hand, in the technique disclosed in Japanese Laid-Open Patent Application No. 2004-056093, the frame including the first resin layer 2 is arranged on the silicon wafer 1, and the semiconductor-chip accommodating part is formed.

However, when forming the first resin layer 2 selectively on the wafer 1, thermal shrinkage may arise in the first resin layer 2. This is shown in FIG. 9A, and the warpage arises at the corners A1 of the first resin layer 2, which may reduce the opening dimension at the corners.

For this reason, it is necessary to set up the opening dimension by taking into consideration the deformation of such corner parts.

Moreover, the first resin layer 2 is formed in the shape of a closed frame, and, when forming the first organic insulating layer 7, the air included between the first component accommodating parts 3 and the first semiconductor chip 4 may not be discharged appropriately. As shown in FIG. 10, there is a possibility that the voids 19 be formed in the lower part of the first organic insulating layer 7.

On the other hand, the vias 10 are formed in the second resin layer 9, and, if thermal shrinkage arises in the second resin layer 9, there is a possibility that the vias 10 are deformed in the direction X as shown in FIG. 11 or in the direction Y as shown in FIG. 12. Reference numeral 10a in FIG. 11 and FIG. 12 indicates the deformed vias.

Moreover, when forming the via opening 10 in the second resin layer 9, the bottom edges B1 of the via opening 10 may be sharp edges as shown in FIG. 13, and the difficulty in forming the seed layer (for example, copper) at the bottom edges B1 may arise.

SUMMARY OF THE INVENTION

An object of the present invention is to provide an improved semiconductor device in which the above-mentioned problems are eliminated.

Another object of the present invention is to provide a semiconductor device in which one or more semiconductor chips can be mounted on a substrate with high density and high reliability.

Another object of the present invention is to provide a method of manufacturing a semiconductor device in which one or more semiconductor chips can be mounted on a substrate with high density and high reliability.

The above-mentioned objects of the present invention are achieved by a semiconductor device comprising: a frame provided on a substrate to form a semiconductor-chip accommodating part on the substrate; a semiconductor chip provided in the semiconductor-chip accommodating part; an organic insulating layer provided to cover the semiconductor chip and the frame; and a wiring layer provided on the organic insulating layer, the frame comprising gaps which are arranged in a longitudinal direction of the frame.

According to the above-mentioned invention, even if the deformation of the frame occurs due to the heating, this deformation is absorbed in the gaps arranged in the longitudinal direction of the frame. Therefore, it is possible to prevent the deformation of the semiconductor-chip accommodating part in which the semiconductor chip is held, which makes it possible to reliably accommodate the semiconductor chip in the semiconductor-chip accommodating part.

Moreover, the above-mentioned semiconductor device of the invention may be configured so that the gap are arranged in the frame at least at the corners of the semiconductor-chip accommodating part.

According to the above-mentioned invention, the gaps which function to absorb the stress are arranged in the position where the stress concentration tends to arise, and it is possible to reliably prevent the deformation of the semiconductor-chip accommodating part.

Moreover, the above-mentioned semiconductor device of the invention may be configured so that the frame is made of a photosensitive resin material.

According to the above-mentioned invention, it is possible to easily form the frame comprising the gaps.

Moreover, the above-mentioned objects of the present invention are achieved by a semiconductor device comprising: a first frame provided on a substrate to form a first semiconductor-chip accommodating part on the substrate; a first semiconductor chip provided in the first semiconductor-chip accommodating part; a first organic insulating layer provided to cover the first semiconductor chip and the first frame; a first wiring layer provided on the first organic insulating layer; a second frame provided on the first organic insulating layer and the first wiring layer to form a second semiconductor-chip accommodating part on the first organic insulating layer and the first wiring layer; a second semiconductor chip provided in the second semiconductor-chip accommodating part; a second organic insulating layer provided to cover the second semiconductor chip and the second frame; and a second wiring layer provided on the second organic insulating layer, each of the first frame and the second frame comprising gaps which are arranged in a longitudinal direction thereof.

According to the above-mentioned invention, it is possible to prevent the deformation of the semiconductor-chip accommodating part in which the semiconductor chip is held, which makes it possible to reliably accommodate the semiconductor chip in the semiconductor-chip accommodating part.

Moreover, the above-mentioned semiconductor device of the invention may be configured so that a maximum outside dimension of the second frame (upper part) is smaller than a maximum outside dimension of the first frame (lower part).

According to the above-mentioned invention, the circumferential part of the first frame is in the state where it is exposed from the second frame. The circumferential part of the first frame is a part where irregularity on the surface thereof tends to arise. Since the semiconductor chip is mounted in the upper part of the first frame except for the position where the irregularity tends to arise, it is possible to prevent the occurrence of undesired mounting, such as the inclination of the semiconductor chip mounted in the upper part of the first frame.

Moreover, the above-mentioned semiconductor device of the invention may be configured so that openings are formed at the center portion in a width direction of the organic insulating layer.

According to the above-mentioned invention, even if contraction stress occurs in the organic insulating layer, it is possible to prevent the deformation of the opening by the formation of the openings at the center portion of the organic insulating layer.

Moreover, the above-mentioned semiconductor device of the invention may be configured so that a plurality of openings are arranged sidewise in the organic insulating layer, and dummy vias are provided at the ends of the plurality of openings.

According to the above-mentioned invention, the plurality of openings are arranged sidewise in the organic insulating layer and the dummy vias are provided at the ends of the plurality of openings, and even if thermal contraction stress occurs in the organic insulating layer, the deformation of the organic insulating layer can be absorbed with the dummy vias.

Moreover, the above-mentioned semiconductor device of the invention may be configured so that the outside corners of the frame which are located at corners of the semiconductor-chip accommodating part are rounded.

According to the above-mentioned invention, the formation of the rounded outside corners of the frame allows the wettability (bonding characteristic) of the frame to the resin layer to improve, and it is possible to prevent the exposing portion of the frame at the outside corners thereof.

Moreover, the above-mentioned objects of the invention are achieved by a method of manufacturing a semiconductor device, the method comprising the steps of: providing a frame on a substrate to form a semiconductor-chip accommodating part on the substrate, the frame comprising gaps which are arranged in a longitudinal direction of the frame; providing a semiconductor chip in the semiconductor-chip accommodating part which is formed by the frame; providing an organic insulating layer to cover the semiconductor chip and the frame; and providing a wiring layer on the organic insulating layer.

According to the above-mentioned invention, the gaps are formed in the frame before forming the organic insulating layer, and the air existing between the substrate, the frame and the organic insulating layers flows out outside through the gaps, and it is possible to prevent that the void occurs in the semiconductor device.

The above-mentioned manufacture method of the invention may be configured so that, when the frame is provided on the substrate, the gaps are arranged in the frame at least at corners of the semiconductor-chip accommodating part.

According to the above-mentioned invention, the gaps which function to absorb the stress are formed at the position where the stress concentration tends to occur. The deformation of the frame can be prevented reliably.

According to the preferred embodiment of the invention, it is possible to reliably prevent the deformation of the semiconductor-chip accommodating part in which the semiconductor chip is held, which makes it possible to reliably accommodate the semiconductor chip in the semiconductor-chip accommodating part.

Moreover, according to the preferred embodiment of the invention, it is possible to reliably prevent the deformation of the semiconductor-chip accommodating part.

Moreover, according to the preferred embodiment of the invention, it is possible to easily form the frame which comprise the gaps arranged in the longitudinal direction of the frame.

Moreover, according to the preferred embodiment of the invention, it is possible to prevent the occurrence of undesired mounting, such as the inclination of the semiconductor chip mounted in the upper part of the first frame.

Moreover, according to the preferred embodiment of the invention, even if contraction stress occurs in the organic insulating layer, it is possible to prevent the deformation of the opening.

Moreover, according to the preferred embodiment of the invention, even if thermal contraction stress occurs in the organic insulating layer, the deformation of the organic insulating layer can be absorbed with the dummy vias.

Moreover, according to the preferred embodiment of the invention, it is possible to prevent the exposure of the frame at the corners thereof.

Moreover, according to the preferred embodiment of the invention, the air existing between the substrate, the frame and the organic insulating layer flows out to the outside through the gaps, and it is possible to prevent the occurrence of the void in the semiconductor device.

Moreover, according to the preferred embodiment of the invention, the gaps which function to absorb the stress are arranged at the positions where the stress concentration tends to arise, and it is possible to reliably prevent the deformation of the frame.

BRIEF DESCRIPTION OF THE DRAWINGS

Other objects, features and advantages of the present invention will be apparent from the following detailed description when read in conjunction with the accompanying drawings.

DETAILED DESCRIPTION OF PREFERRED EMBODIMENTS

A description will now be given of the preferred embodiments of the present invention with reference to the accompanying drawings.

Figure 1A:
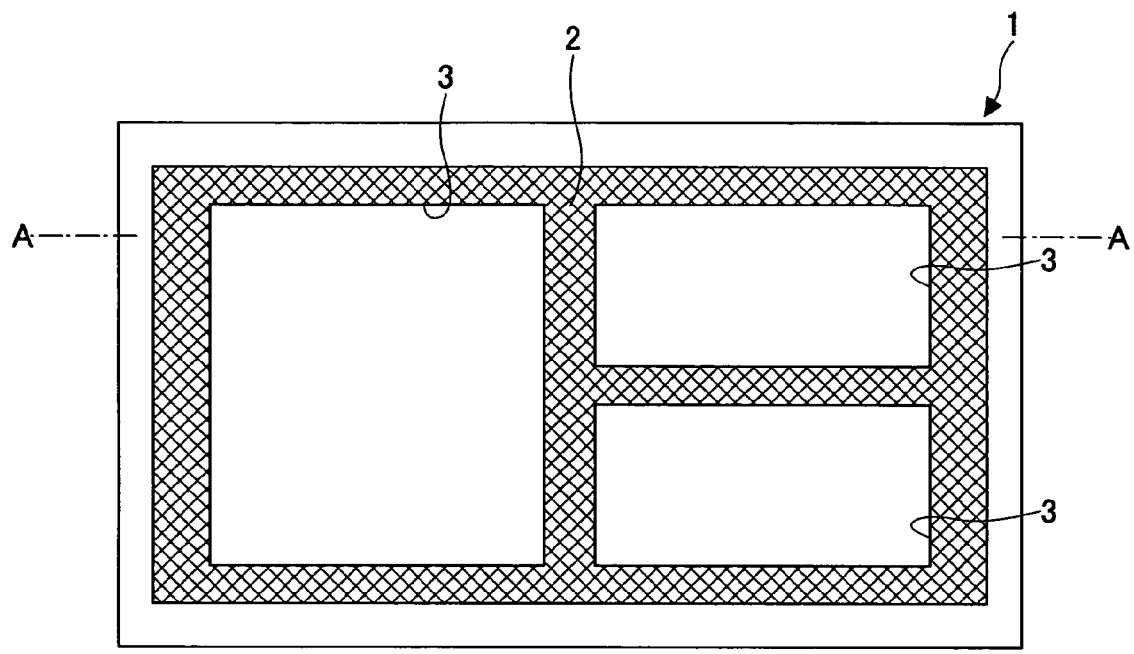
FIG. 1A and FIG. 1B are diagrams showing the processing to form the first resin layer on the wafer in the method of manufacturing a conventional semiconductor device.
Figure 1B:
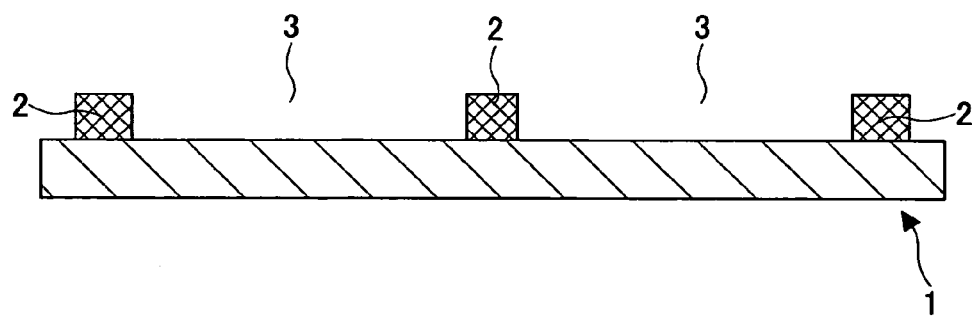
Figure 2A:
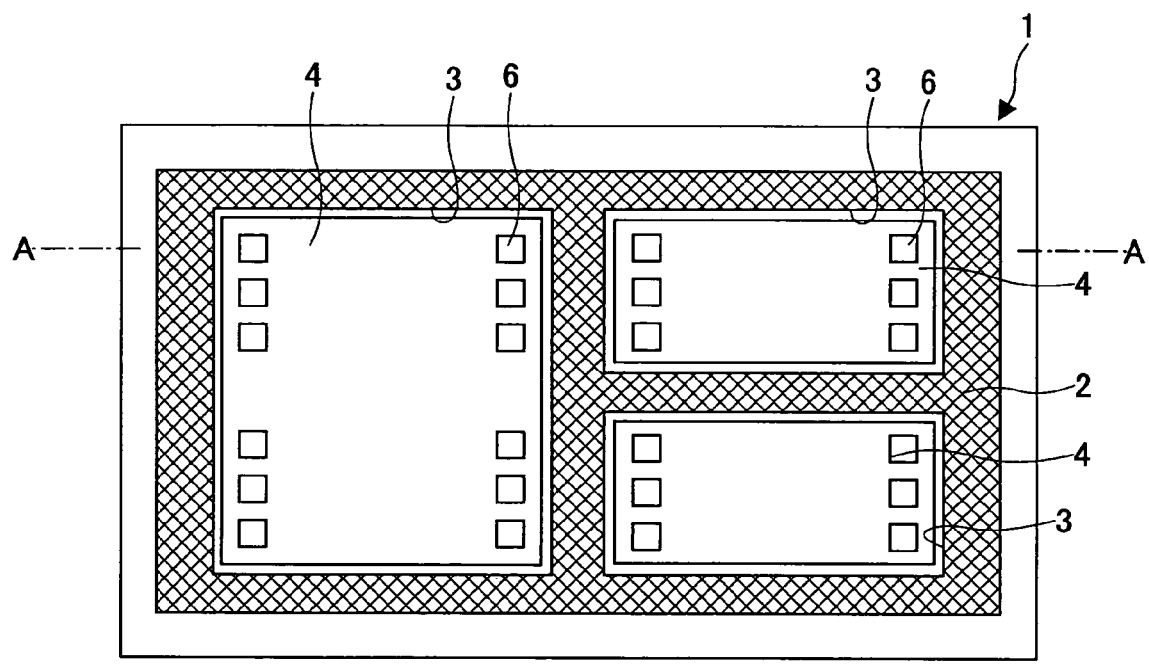
FIG. 2A and FIG. 2B are diagrams showing the processing to mount the first semiconductor chip in the method of manufacturing the conventional semiconductor device.
Figure 2B:
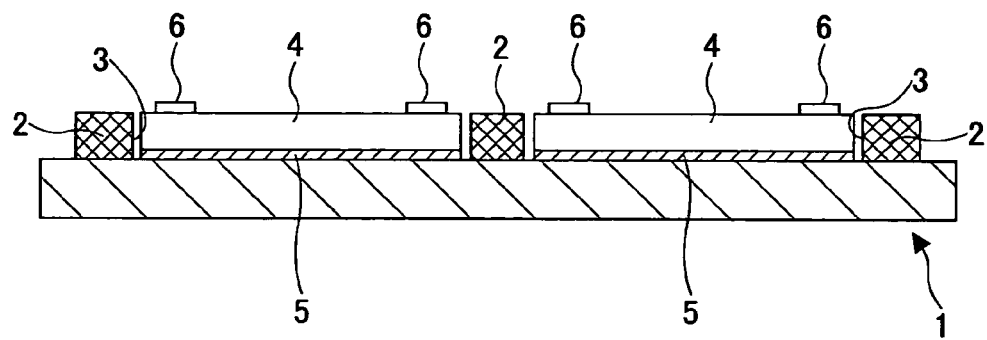
Figure 3A:
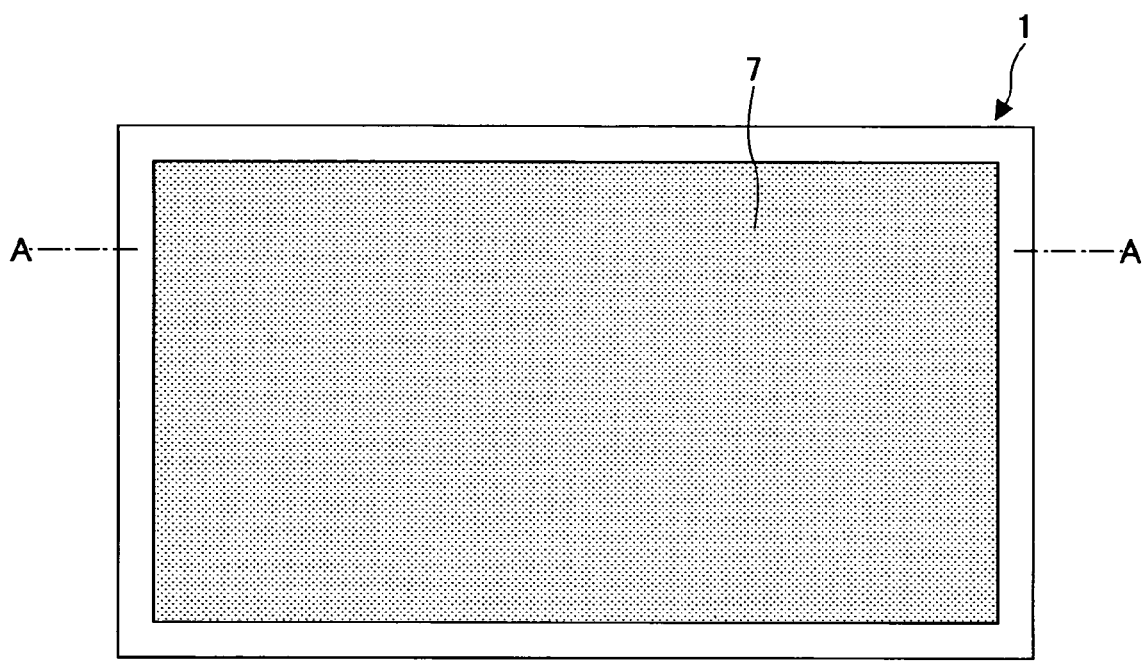
FIG. 3A and FIG. 3B are diagrams showing the processing to form the first organic insulating layer in the method of manufacturing the conventional semiconductor device.
Figure 3B:
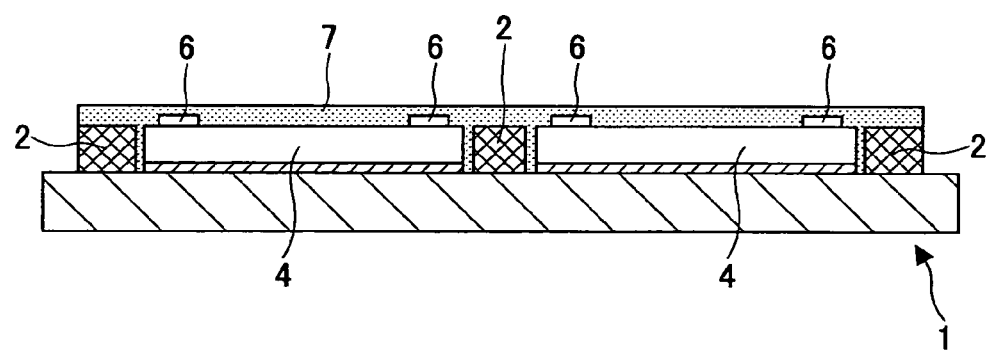
Figure 4A:
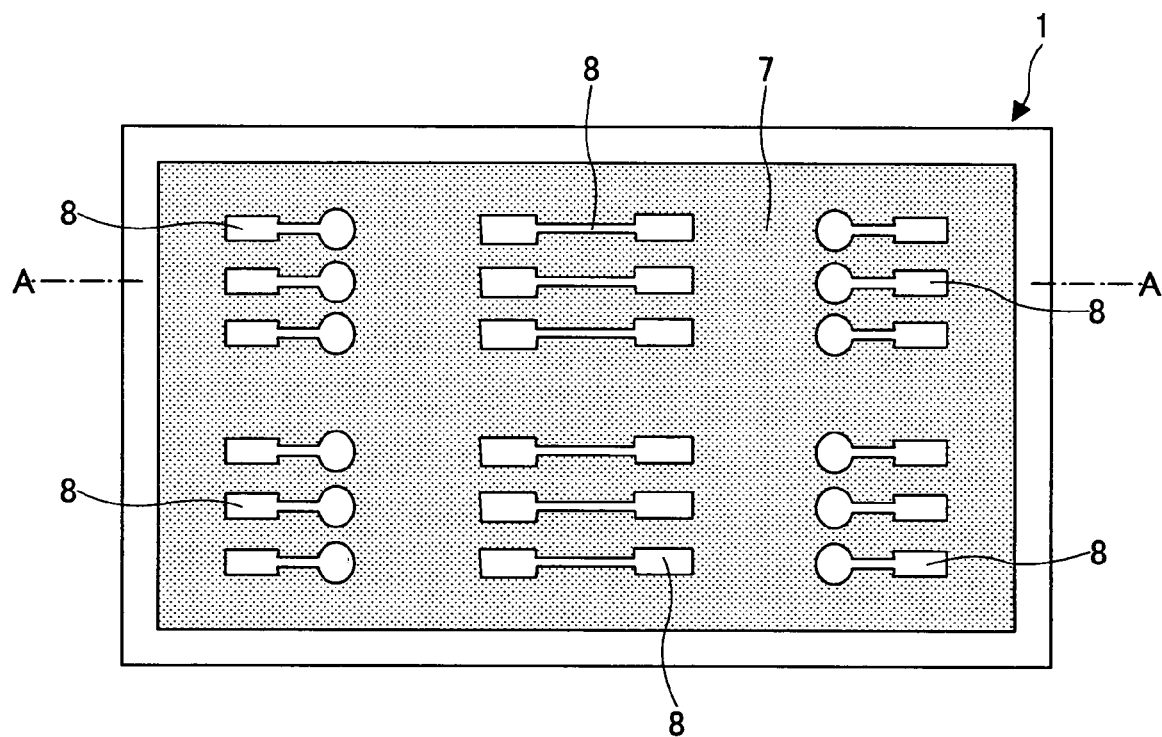
FIG. 4A and FIG. 4B are diagrams showing the processing to form the first reflow wiring on the first organic insulating layer in the method of manufacturing the conventional semiconductor device.
Figure 4B:
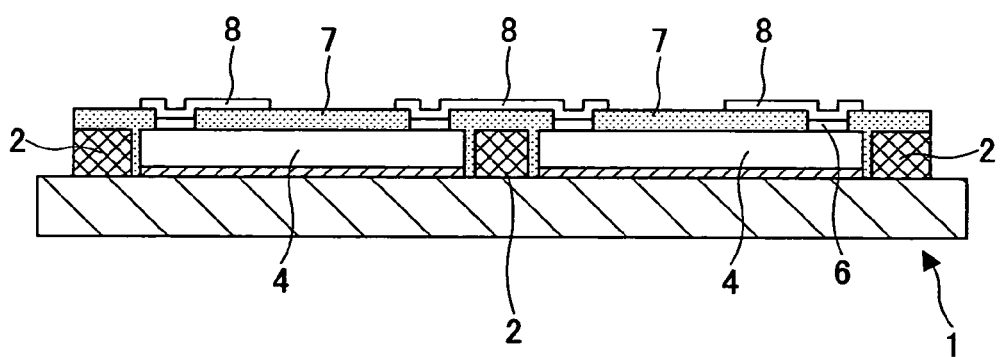
Figure 5A:
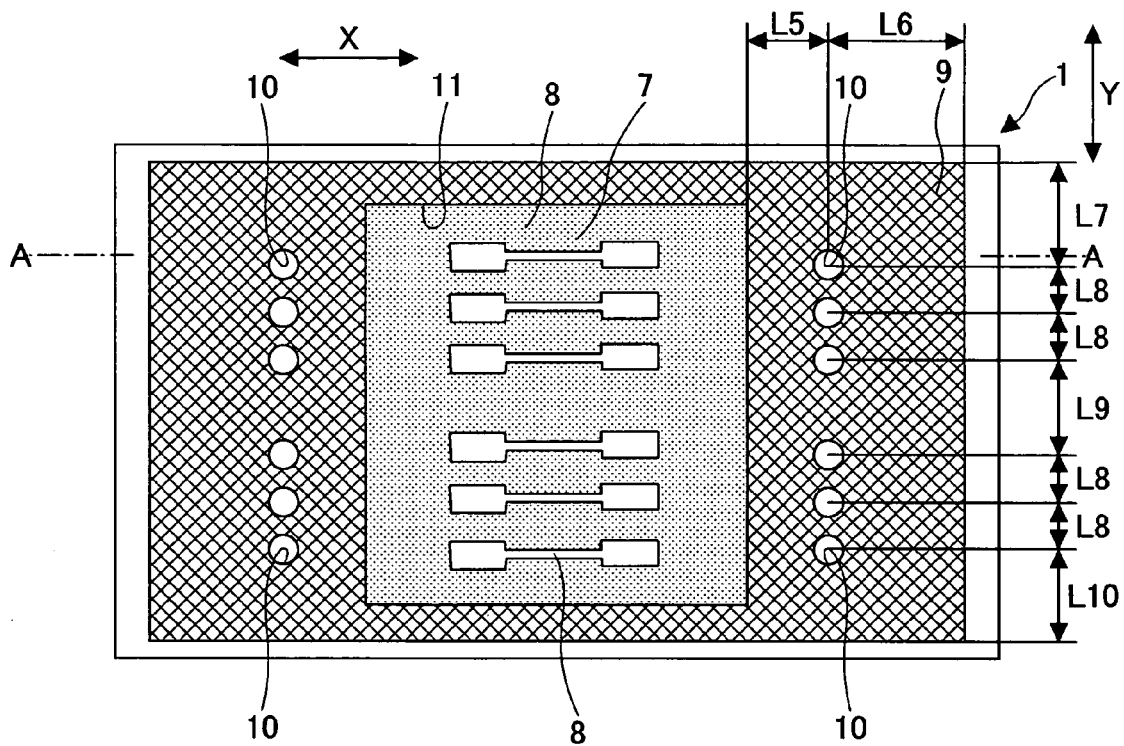
FIG. 5A and FIG. 5B are diagrams showing the processing to form the second resin layer with the vias in the method of manufacturing the conventional semiconductor device.
Figure 5B:
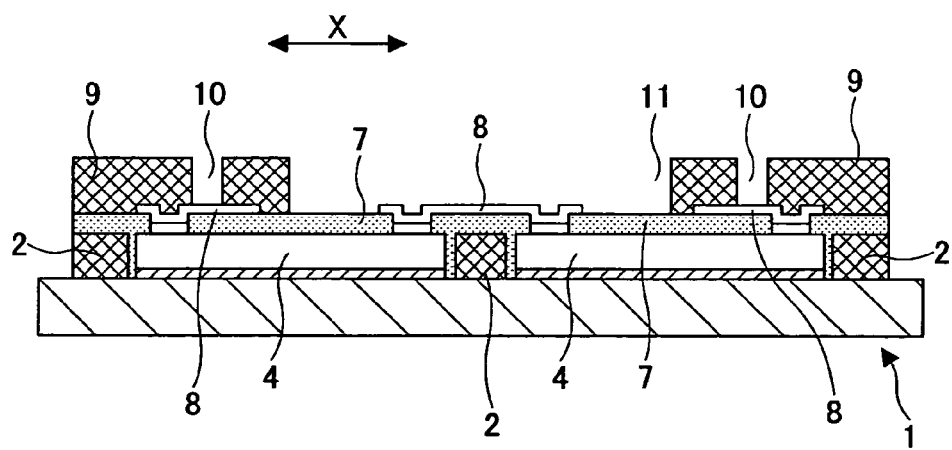
Figure 6A:
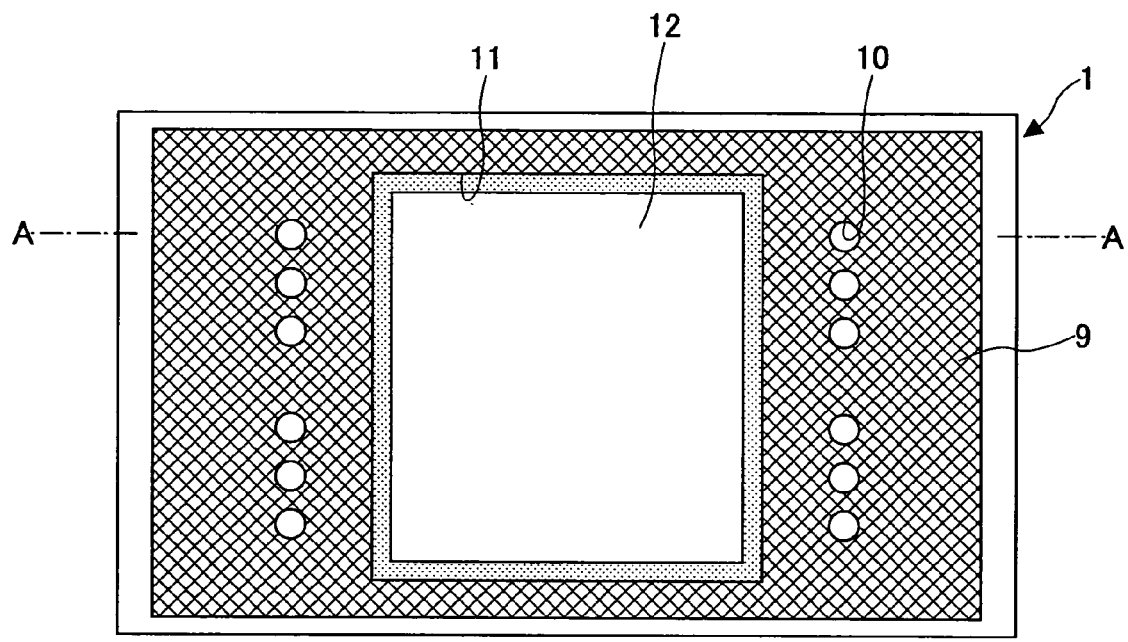
FIG. 6A and FIG. 6B are diagrams showing the processing to mount the second semiconductor chip in the method of manufacturing the conventional semiconductor device.
Figure 6B:
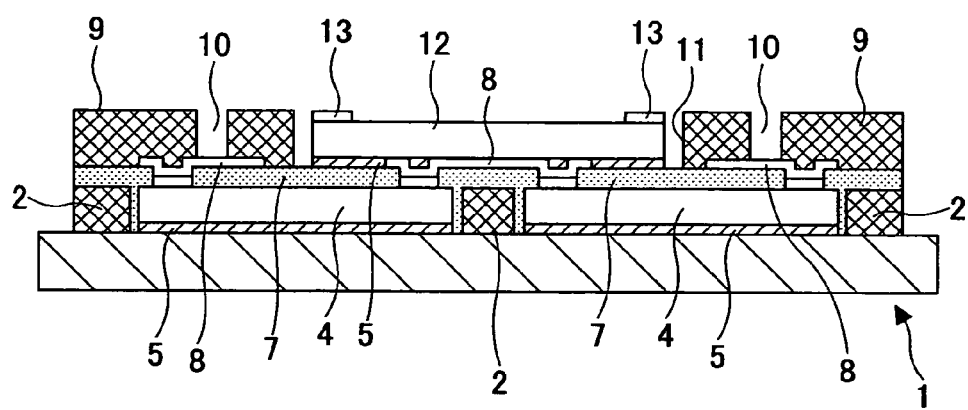
Figure 7A:
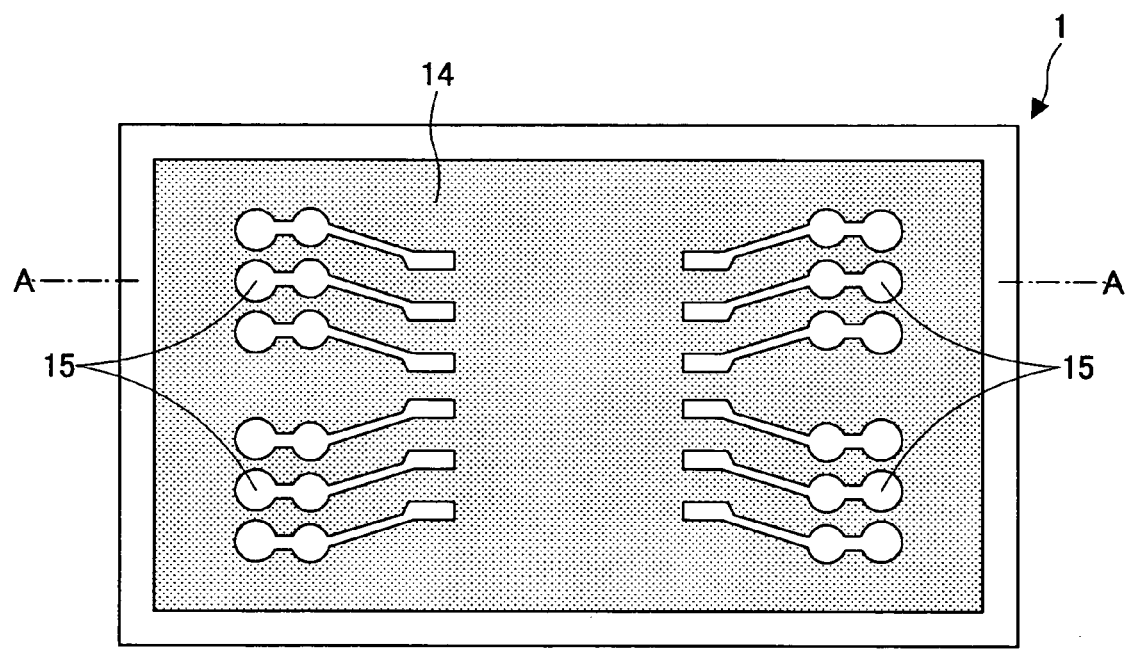
FIG. 7A and FIG. 7B are diagrams showing the processing to form the second organic insulating layer and the second reflow wiring in the method of manufacturing the conventional semiconductor device.
Figure 7B:
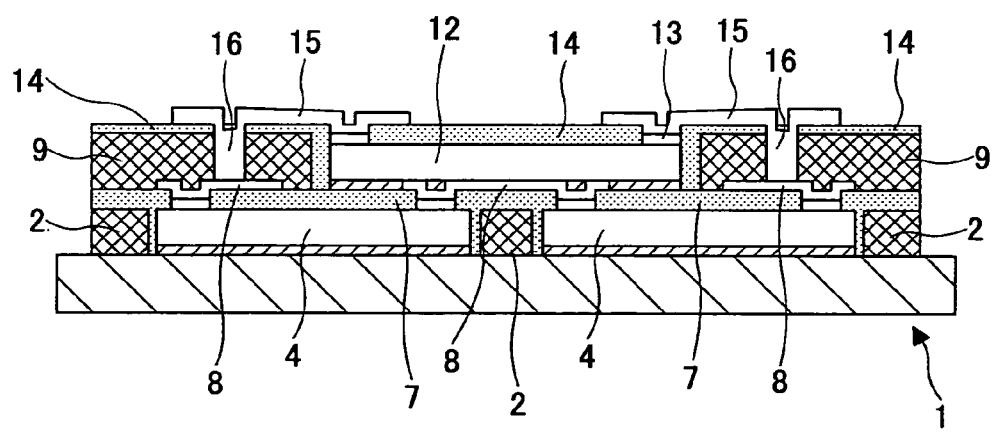
Figure 8A:
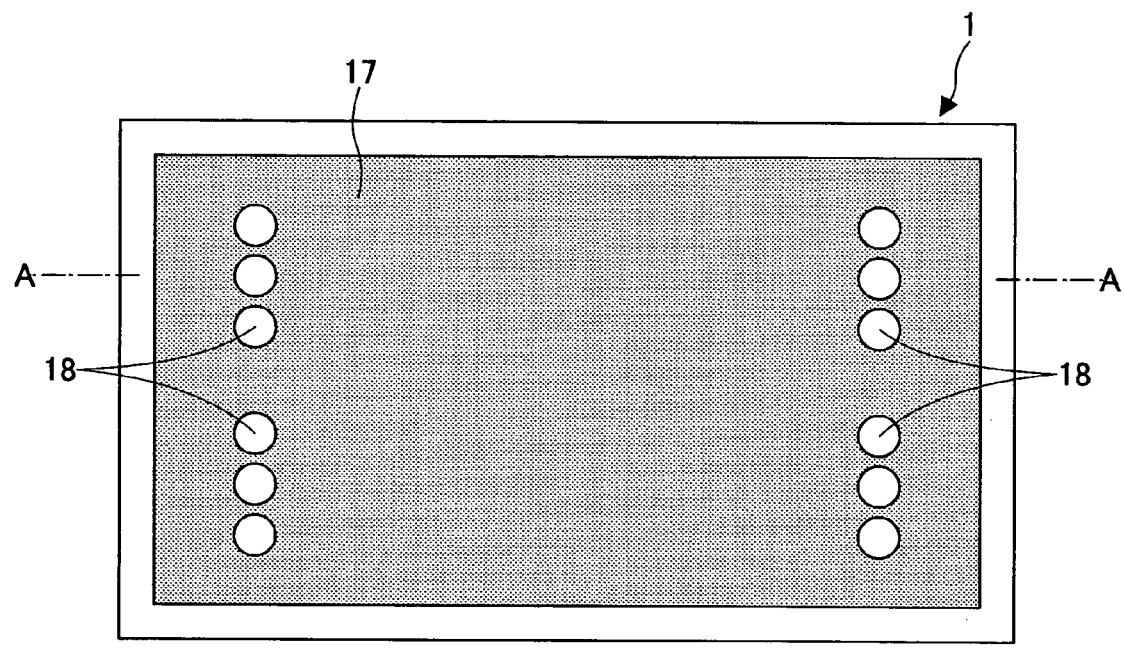
FIG. 8A and FIG. 8B are diagrams showing the processing to form the covering film and the external terminals in the method of manufacturing the conventional semiconductor device.
Figure 8B:
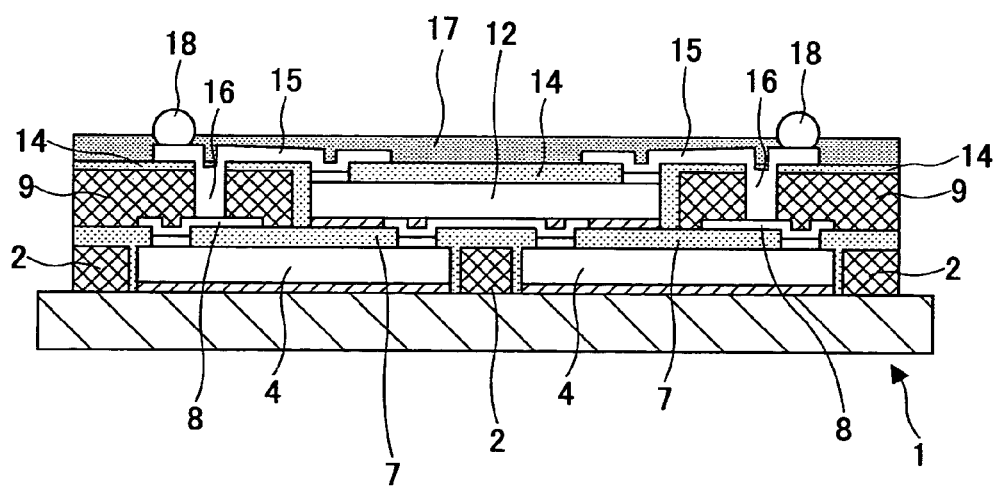
Figure 9:
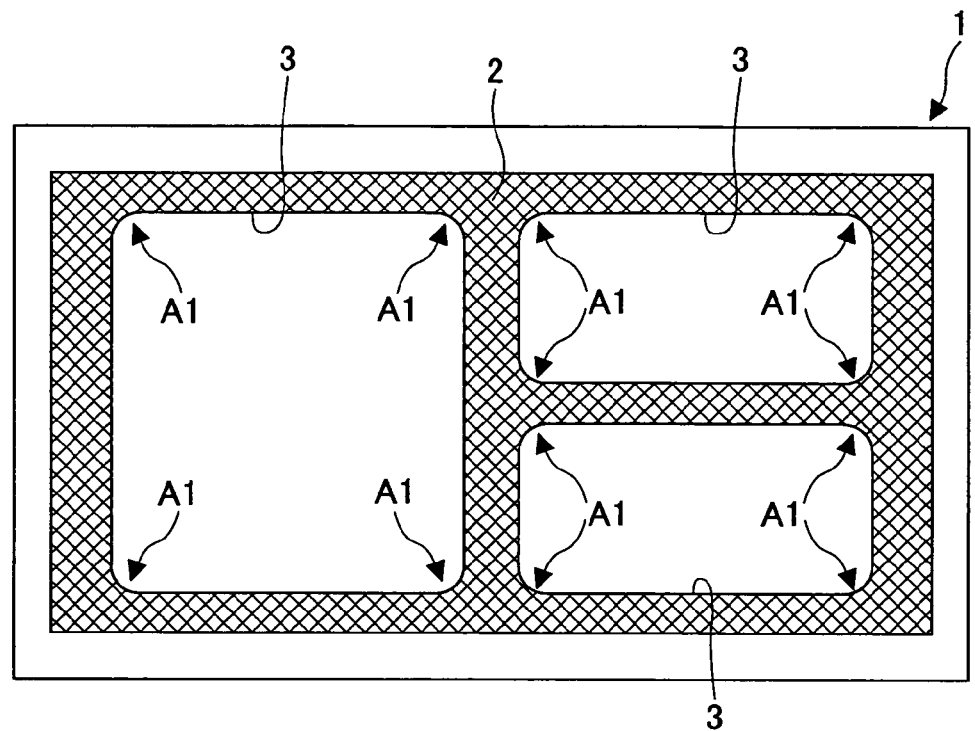
FIG. 9 is a diagram for explaining the problem arising in the conventional semiconductor device.
Figure 10:
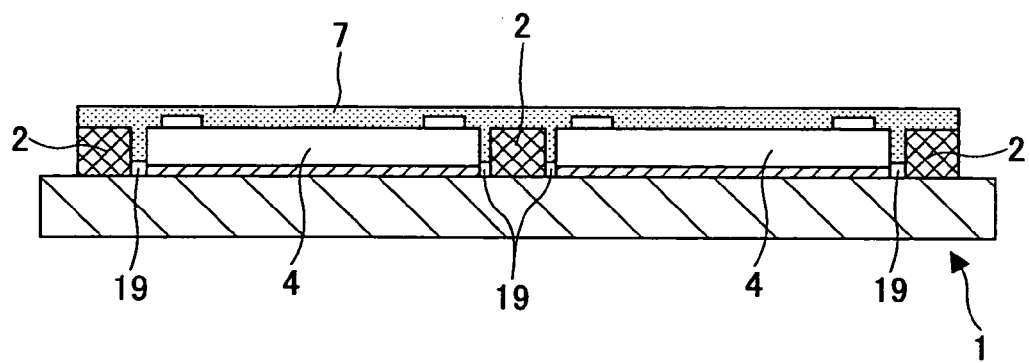
FIG. 10 is a diagram for explaining the problem arising in the conventional semiconductor device.
Figure 11:
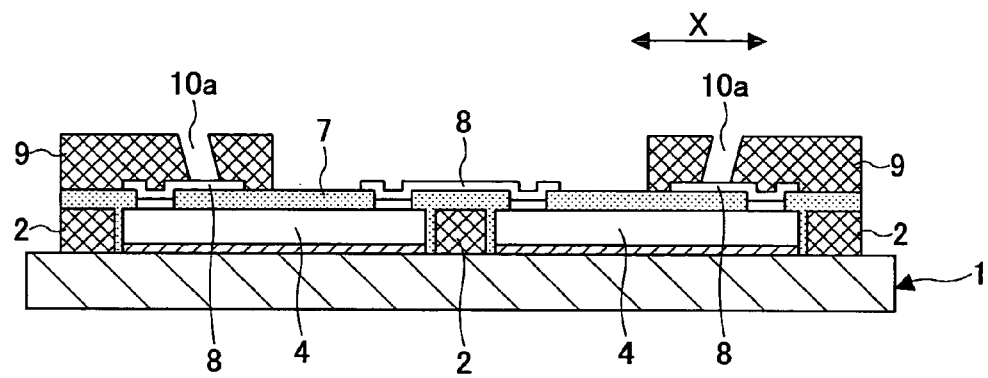
FIG. 11 is a diagram for explaining the problem arising in the conventional semiconductor device.
Figure 12:
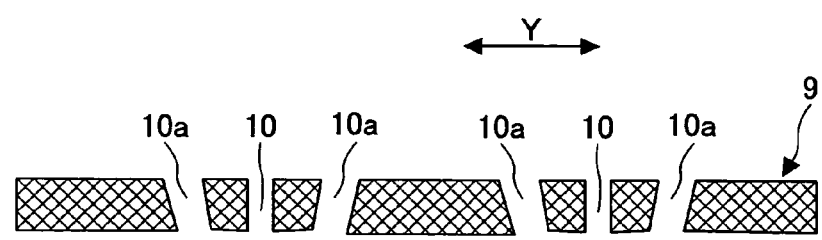
FIG. 12 is a diagram for explaining the problem arising in the conventional semiconductor device.
Figure 13:
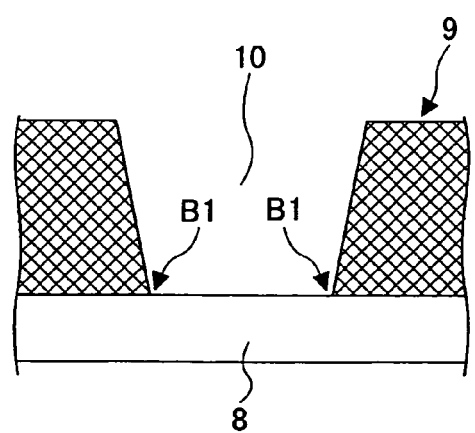
FIG. 13 is a diagram for explaining the problem arising in the conventional semiconductor device.
Figure 14A:
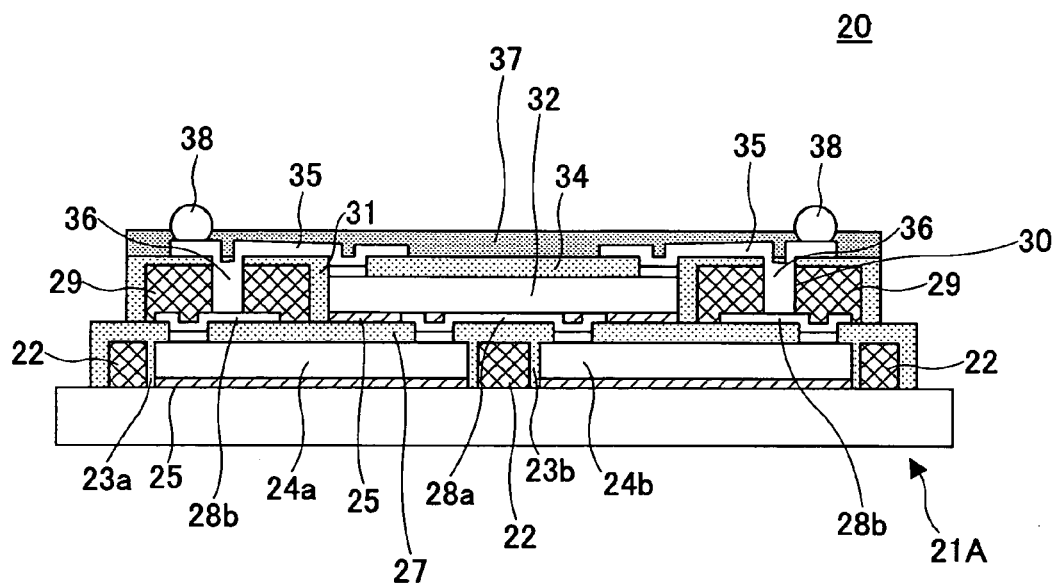
FIG. 14A and FIG. 14B are diagrams showing the semiconductor device in a preferred embodiment of the invention.
Figure 14B:
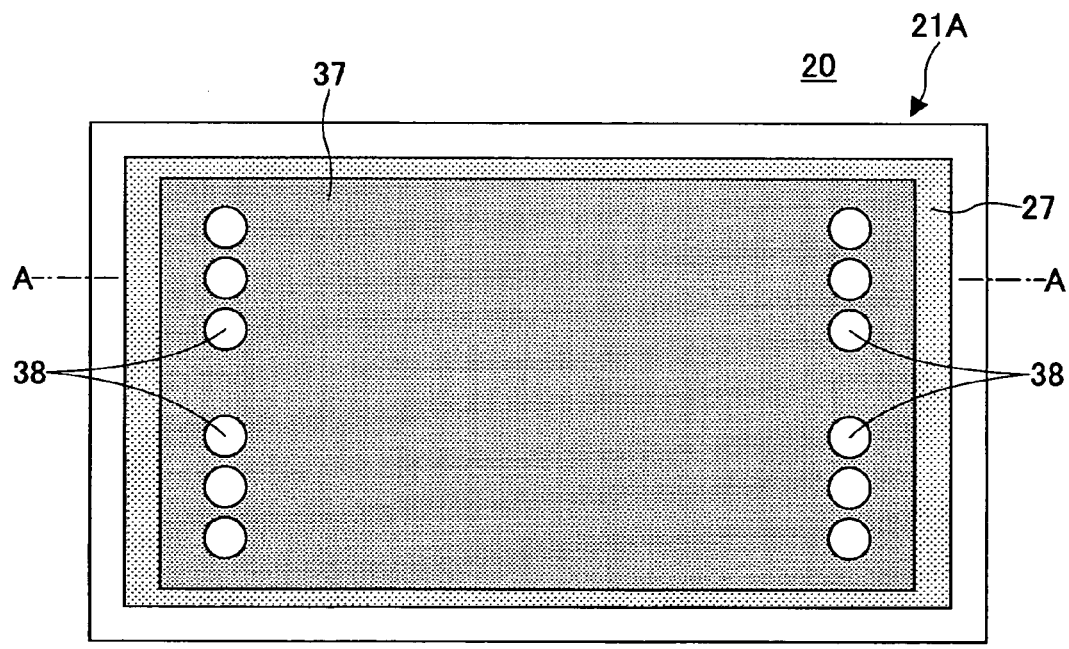

FIG. 14A and FIG. 14B show the semiconductor device 20 in the preferred embodiment of the invention. FIG. 14B is a plan view of the semiconductor device 20, and FIG. 14A is a cross-sectional view of the semiconductor device 20 taken along the line A-A indicated in FIG. 14B.

The semiconductor device 20 in this embodiment has the composition wherein one or more semiconductor chips are mounted on a single substrate. Specifically, in the present embodiment, two semiconductor chips are arranged in the lower layer of the semiconductor device, and one semiconductor chip is arranged in the upper layer of the semiconductor device. However, it is a matter of course that the present invention is not limited to this composition.

The semiconductor device 20 in the present embodiment generally includes the substrate 21A (wafer 21), the first semiconductor chips 24a and 24b arranged in the part formed by the first frame 22, the second frame 29 arranged on the first semiconductor chip 24 and the first frame 22 through the first organic insulating layer 27, the second semiconductor chip 32 arranged in the part formed by the second frame 29, the surface covering film 37, and the external connection terminals 38.

The substrate 21A is the silicone (Si) substrate, and the first frame 22 is selectively formed on the top surface of the substrate 21A to form the semiconductor-chip accommodating part 23 thereon. The first frame 22 is formed with the resin layer which is made of a photosensitive resin material (photo-resist) and selectively divided into an island-like formation.

Figure 15A:
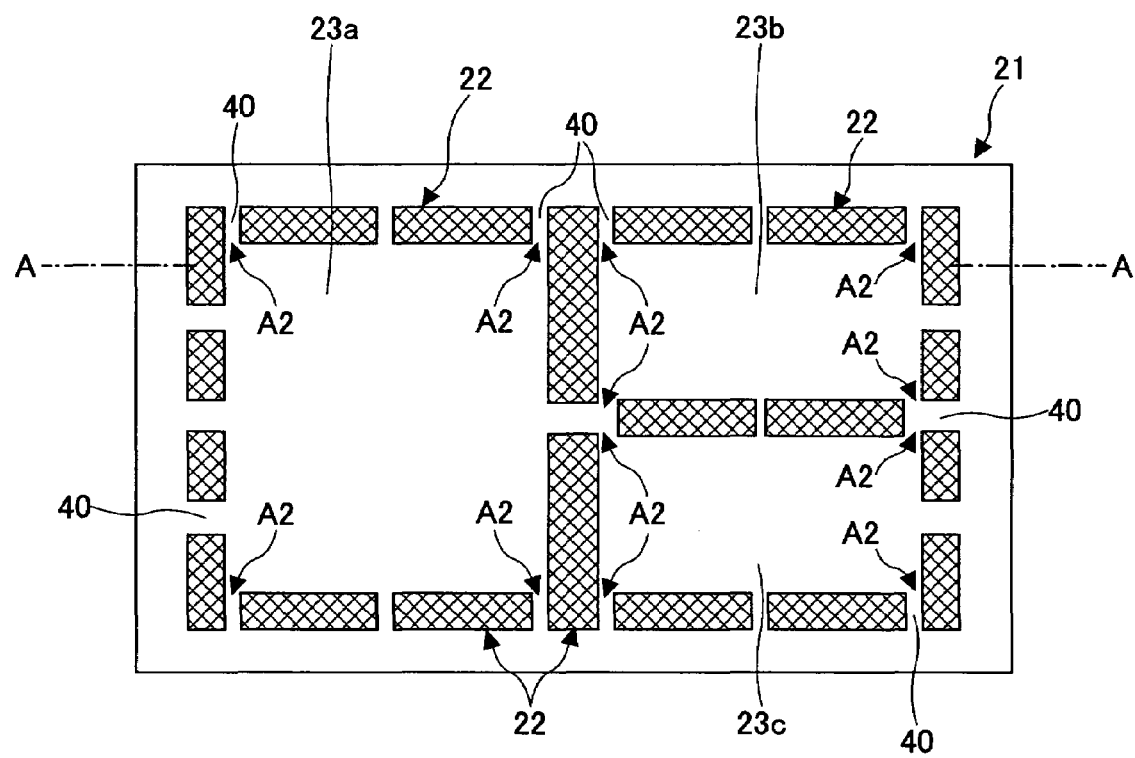
FIG. 15A and FIG. 15B are diagrams showing the processing to form the first resin layer on the wafer in the method of manufacturing the semiconductor device in a preferred embodiment of the invention.
Figure 15B:
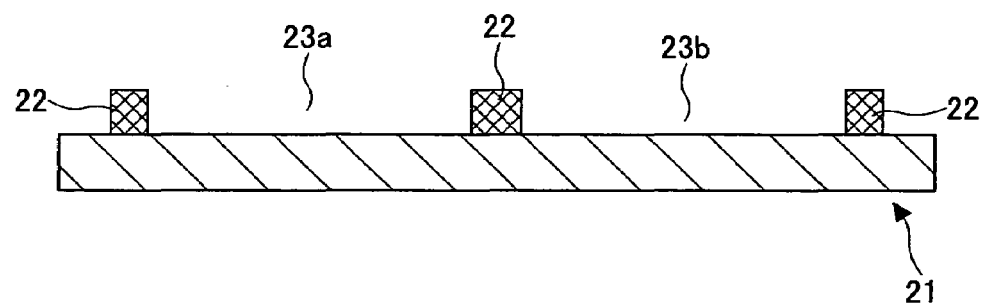

As shown in FIG. 15A and FIG. 15B, the semiconductor-chip accommodating parts 23a and 23b are formed by the first frame 22, and the first semiconductor chips 24a and 24b are held in the semiconductor-chip accommodating parts 23a and 23b in the face-up manner, respectively. The first semiconductor chips 24a and 24b are bonded to the substrate 21 by the adhesive agent 25.

In the present embodiment, the two semiconductor chips are arranged as the first semiconductor chips. However, the present invention is not limited to this composition, and the number of the first semiconductor chips arranged may be arbitrarily set up.

The first semiconductor chips 24 may be chosen from among the processor components, the logic-circuit components, and the memory components depending on the kind of the electronic equipment on which the semiconductor device is carried.

And the first organic insulating layer 27 which is made of a polyimide resin is arranged to cover the first frame 22 and the first semiconductor chips 24a and 24b. The first organic insulating layer 27 is arranged so that it protects the first semiconductor chips 24a and 24b and provides the insulation from the second semiconductor chip 32 arranged on the first semiconductor-chips 24a and 24b.

The first reflow wiring 28 is arranged on the first organic insulating layer 27, and one end of the first reflow wiring 28 is connected to the electrodes of the first semiconductor chip 24.

The first reflow wiring 28 comprises the wiring 28a which connects the semiconductor chip 24a and the semiconductor chip 24b, and the wiring 28b connected to the external connection terminals, etc.

And the second frame 29 is arranged on the first organic insulating layer 27, and the second semiconductor chip 32 is held in the second component accommodating part 31 which is formed by the second frame 29.

As this second semiconductor chip 32, the semiconductor chip which operates in association with the first semiconductor chips 24 is usually chosen.

The second frame 29 is made of a photosensitive resin material that is the same as the material of the first frame 22, and arranged to form the second component accommodating part 31. The plurality of the vias 30 are formed and arranged sidewise in the vicinity of the second component accommodating part 31.

Moreover, in the present embodiment, the maximum outside dimension of the second frame 29 is smaller than the maximum outside dimension of the first frame 22. When the second frame 29 is arranged on the first frame 22 through the insulating layer 27, the first organic insulating layer 27 which covers the first frame 22 is exposed from the circumference of the lower part of the second frame 29.

Furthermore, in the present embodiment, the second organic insulating layer 34 is arranged to cover both the second frame 29 and the second semiconductor chip 32. The second same organic insulating layer 34 is made of an insulating material which is the same as the insulating material of the first organic insulating layer 27, such as the polyimide resin.

The second reflow wiring 35 is arranged on the second organic insulating layer 34, and the second reflow wiring 35 is electrically connected at one end to the electrodes of the second semiconductor chip 32, and electrically connected at the other end to the terminals 38 for external connection.

Moreover, the second reflow wiring 35 is electrically connected with the first reflow wiring 28 through the interlayer connection 36 which is formed in the vias 30. Therefore, the first semiconductor chips 24, the second semiconductor chip 32, and the external terminals 38 are electrically connected together through the first reflow wiring 28, the second reflow wiring 35, and the interlayer connection 36 (via).

Furthermore, the covering film 37 which is made of a polyimide resin is arranged on the second reflow wiring 35 and the second organic insulating layer 34. The covering film 37 functions as a solder resist, and the through holes are formed at the positions of the second reflow wiring 35 corresponding to the electrode pads. The external connection terminals 38 which comprise the solder balls electrically and mechanically connected to the second reflow wiring 38 are arranged in the through holes.

Next, the manufacture method of the semiconductor device 20 in the present embodiment will be explained with reference to FIG. 15A through FIG. 21B.

In these drawings, each of FIGS. 15B, 16B, 17B, 18B, 19B, 20B and 21B is a cross-sectional view of the semiconductor device taken along the line A-A indicated in the corresponding one of the plan views of FIGS. 15A, 16A, 17A, 18A, 19A, 20A and 21A, respectively. In addition, the portion corresponding to the single semiconductor device 20 which is enlarged for the sake of description is shown in FIG. 15A through FIG. 21B.

As shown in FIG. 15A and FIG. 15B, the first frame 22 is formed on the silicone (Si) wafer 21. The first frame 22 in this embodiment forms the component accommodating parts 23a, 23b, and 23c for the semiconductor chips 24a, 24b, and 24c. The first frame 22 has the configuration in the shape of a rectangular parallelepiped with a width of 200 micrometers and a height of 50 micrometers. The first frame 22 comprises the gaps 40 having a width of about 50 micrometers which are arranged in the longitudinal direction. The first frame 22 is interrupted by the gaps 40. The first frame 22 is arranged in the shape of a rectangular and forms the semiconductor-chip accommodating parts 23 on the wafer 21.

The first frame 22 is formed as follows. In accordance with the usual photolithography process, the photosensitive resin (photoresist) layer is applied and formed on the wafer 21. The selective exposure and development processing of the photosensitive resin (photoresist) layer is performed, and the first frame 22 is formed by performing the heat treatment further (curing).

Moreover, the first frame 22 is arranged so that the gaps 40 may exist at the corners A2 of the component accommodating part 23 in the shape of a rectangle. The gaps 40 are arranged in the longitudinal direction of the first frame 22 so that the adjacent side portions of the rectangle are mutually separated by the gaps 40.

That is, the first frame 22 is arranged so that the frame portions are mutually separated in an island-like formation, and the gaps 40 form the openings in the direction that is parallel to the side surface, i.e., the front surface face of the wafer 21.

At this time, the height of the first frame 22 is chosen so that the top surface of the first frame 22 and the top surface of the first semiconductor chip 24 are almost flush with each other.

Figure 16A:
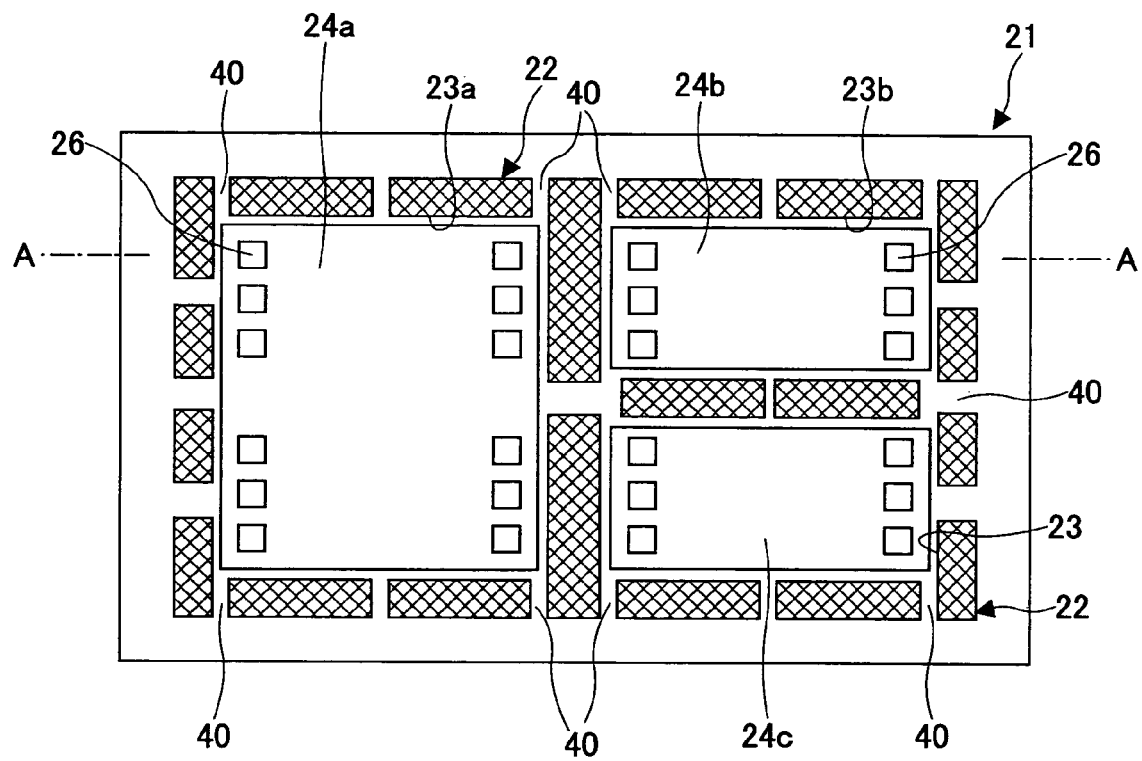
FIG. 16A and FIG. 16B are diagrams showing the processing to mount the first semiconductor chip in the method of manufacturing the semiconductor device in the preferred embodiment of the invention.
Figure 16B:
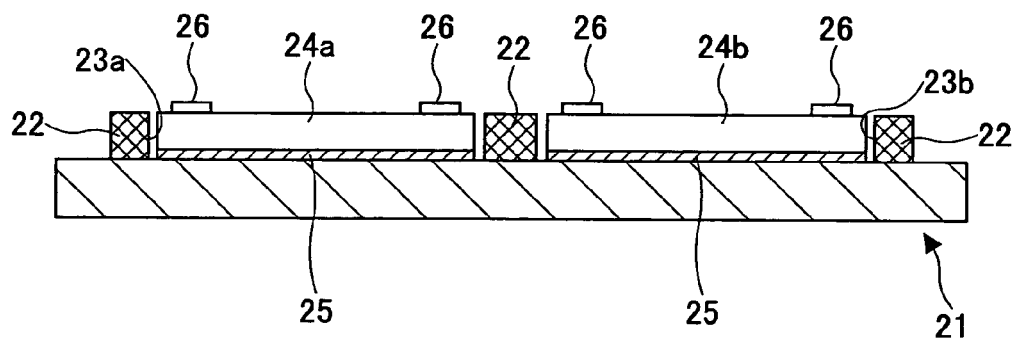

Subsequently, as shown in FIG. 16A and FIG. 16B, the first semiconductor chips 24 (24a, 24b, 24c) are accommodated in the first component accommodating parts 23 which are formed by the first frame 22. The first semiconductor chips 24 are secured to the wafer 21 by the adhesive agent 25 respectively.

At this time, the height of the top surface of the semiconductor chip 24 from the surface of the substrate 21 is set to about 50 micrometers including the thickness of the adhesive agent 25.

Therefore, the height of the top surface of the first frame 22 and the height of the top surface of the semiconductor chip 24 are substantially equal to each other, and both the top surfaces are almost flush with each other.

In the above-described composition, the first frame 22 is arranged so that it is divided by the gaps 40. Therefore, even if thermal shrinkage arises in the first frame 22 during the heat-treatment process (curing), the deformation will be absorbed with the gaps 40, and even in the corner A2 which thermal shrinkage tends to produce, the deformation of the first frame 22 is prevented by the presence of the gaps 40.

Therefore, the first semiconductor chips 24 are easily accommodated in the component accommodating parts 23 which are formed by the first frame 22.

Figure 17A:
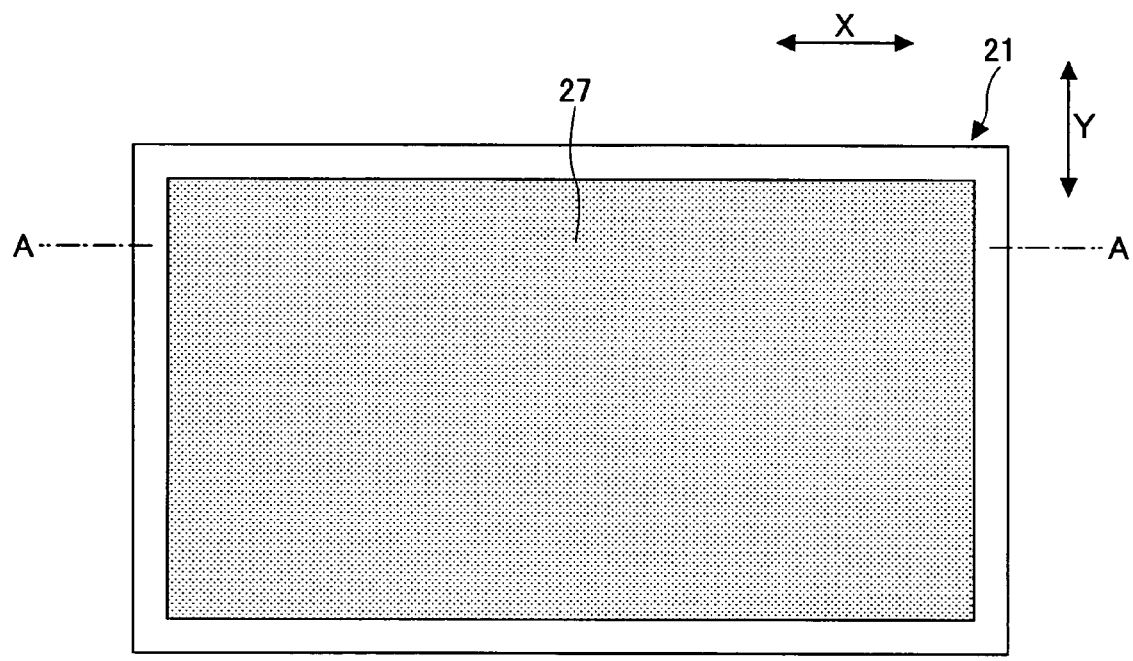
FIG. 17A and FIG. 17B are diagrams showing the processing to form the first organic insulating layer in the method of manufacturing the semiconductor device in the preferred embodiment of the invention.
Figure 17B:
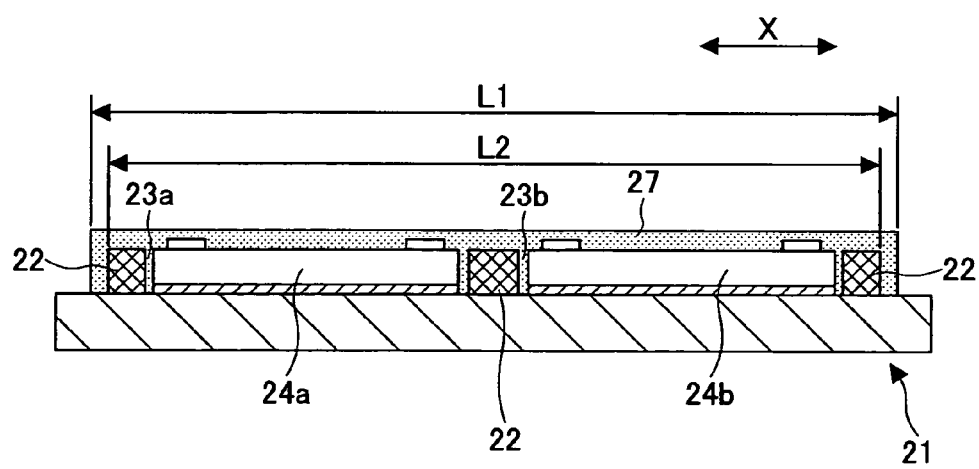

After the first semiconductor chips 24 are fixed to the wafer 21, the first organic insulating layer 27 which is made of a polyimide resin or epoxy resin and covers the first frame 22 and the first semiconductor chips 24 is formed. This state is shown in FIG. 17A and FIG. 17B.

Through the spin coat (rotation application) process or the like, the first organic insulating layer 27 which covers the first semiconductor chips 24 and the first frame 22 is formed in about 5 micrometers in thickness.

By carrying out the spin coat process, the first organic insulating layer 27 absorbs the irregularity existing on the underlying semiconductor chip, on the frame, and in the internal space between them so that the covering surface can be set to the flat surface.

The patterning processing is performed through the photolithography process, and the applied organic insulating layer is left so as to cover not only the surface of the first frame 22 but also the outside circumference side. As a result, the first organic insulating layer 27 is formed.

As shown in FIG. 17B, the maximum dimension L1 in the direction X of the first organic insulating layer 27 is larger than the maximum dimension L2 in the direction X of the first frame 22. Similarly, the maximum dimension in the direction Y of the first organic insulating layer 27 is larger than the maximum dimension in the direction Y of the first frame 22 (not shown).

By forming the first organic insulating layer 27 in this way to cover the first frame 22 completely, it is possible to prevent irregularity on the top surface of the first organic insulating layer 27 from occurring, due to the gaps 40 formed in the first frame 22, when the first organic insulating layer 27 is formed.

Subsequently, the interlayer connection (via) is formed in the first organic insulating layer 27 at the positions corresponding to the electrode pads 26 of the first semiconductor chip 24 through the photolithography technique.

Then, the first reflow wiring 28 is formed on the first organic insulating layer 27 in which the interlayer connection (via) is formed. The first reflow wiring 28 is formed using the copper (Cu) plating method.

Figure 18A:
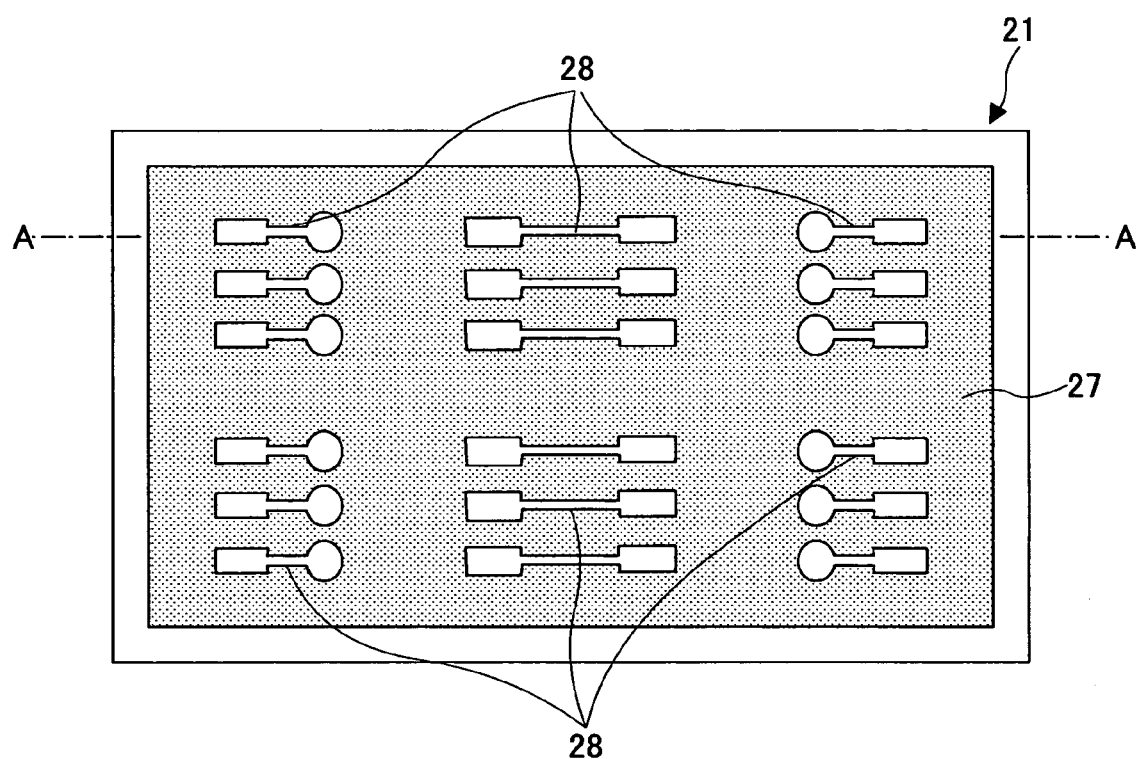
FIG. 18A and FIG. 18B are diagrams showing the processing to form the first reflow wiring on the first organic insulating layer in the method of manufacturing the semiconductor device in the preferred embodiment of the invention.
Figure 18B:
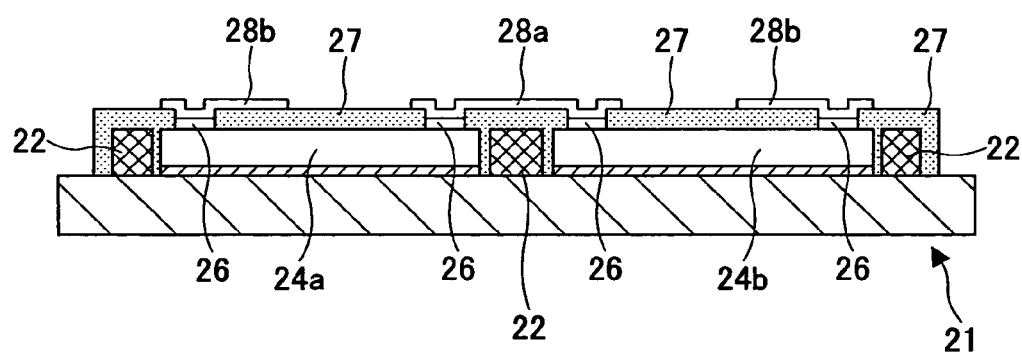

FIG. 18A and FIG. 18B show the state where the first reflow wiring 28 is formed on the first organic insulating layer 27.

As described above, the first reflow wiring 28 comprises the wiring 28a which connects the semiconductor chip 24a and the semiconductor chip 24b, and the wiring 28b connected to the external connection terminals.

In addition, since the wiring which corresponds to the wiring (which is the multi-layer wiring when needed) to constitute the electronic circuit is already formed on the front surface of the semiconductor chip 24, the first reflow wiring 28 is formed after the first organic insulating layer 27 is formed on the semiconductor chip 24, and therefore it is called the reflow wiring.

Figure 19A:
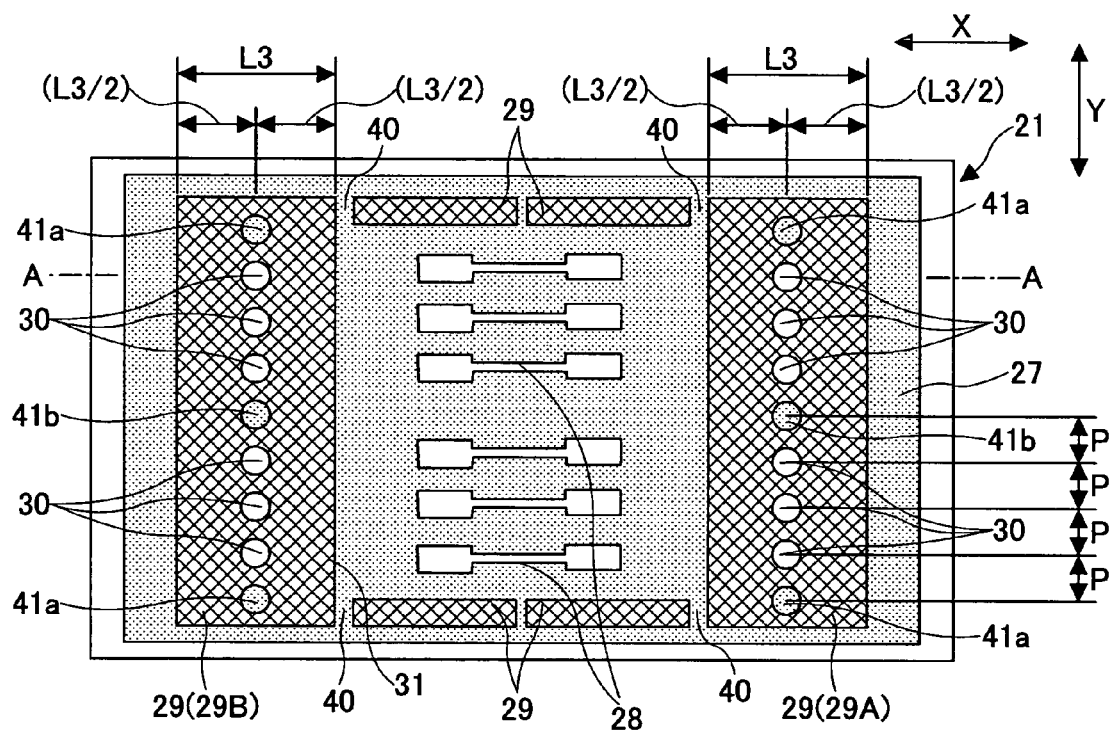
FIG. 19A and FIG. 19B are diagrams showing the processing to form the second resin layer with the vias and the dummy vias in the method of manufacturing the semiconductor device in the preferred embodiment of the invention.
Figure 19B:
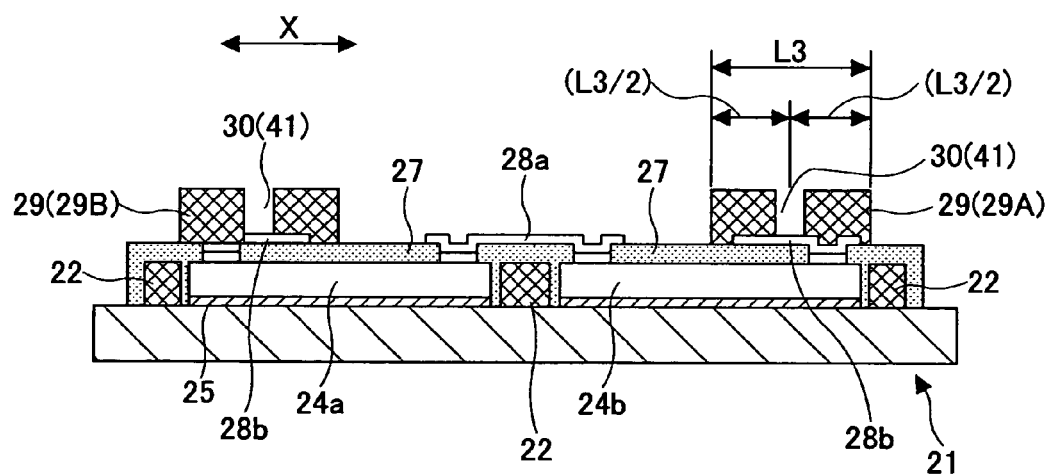

Subsequently, the second frame 29 is arranged on the first organic insulating layer 27 and the reflow wiring layer 28. This second frame 29 is formed in the same manner as the first frame 22. FIG. 19A and FIG. 19B show the state where the second frame 29 is arranged.

As shown in FIG. 19A and FIG. 19B, the second frame 29 is arranged on the first frame 22 so that the maximum outside dimension of the second frame 29 is smaller than the maximum outside dimension of the first frame 22. At this time, the arrangement of the second frame 29 is set up so that the height of the second frame 29 is also substantially equal to the height of the top surface of the semiconductor chip 32 which will be held in the component accommodating part 31 which is formed by the second frame 29. It is chosen so that both the top surfaces of the second frame 29 and the semiconductor chip 32 are substantially flush with each other.

The second component accommodating part 31 is formed by the second frame 29. The plural interlayer connections 30 (vias) and the dummy vias 41 at the ends of the plural interlayer connections 30 are also provided in the second frame 29.

Moreover, in the second frame 29, the gaps 40 are arranged in the longitudinal direction of the second frame 29 at the plural positions including the corners thereof, similar to those in the first frame 22.

In this composition, even if thermal shrinkage arises in the second frame 29 during the heat treatment (curing), the deformation of the second frame 29 will be absorbed with the gaps 40, the component accommodating part 31 is maintained with the predetermined area and configuration, and the second semiconductor chip 32 can be reliably accommodated in the second component accommodating part 31.

Moreover, in this composition, the interlayer connections 30 (vias) arranged in the second frame 29 are formed in the frames 29A and 29B whose locations correspond to the external connection parts (lands) of the first reflow wiring layer 28 formed on the first organic insulating layer 27.

Moreover, the dummy vias 41 are arranged apart from the ends of the interlayer connections 30 (vias) by a predetermined distance. The first reflow wiring layer 28 is not arranged at the bottom parts of the dummy vias 41, and the dummy vias 41 are not at all related to the connection of the reflow wiring layer. The interlayer connections 30 (vias) and the dummy vias 41 are formed simultaneously with the formation of the second frame 29 through the photolithography process.

In each of the second frames 29A and 29B mentioned above, the interlayer connections 30 (vias) and the dummy vias 41 are arranged sidewise in one row in the direction Y at the center portion (or on the centerline) in the width direction X of each of the frames 29A and 29B.

Namely, if the whole width of each of the frames 29A and 29B in the direction X is set to L3, the interlayer connections 30 (vias) and the dummy vias 41 are arranged sidewise in one row in the direction Y at the center portion in the width direction of each of the frames 29A and 29B, whose width is equivalent to L3/2.

By arranging the interlayer connections 30 (vias) and the dummy vias 41 at the center portion of each of the blocks 29A and 29B of the second frame 29, even if the second frame 29 is heated and thermal shrinkage arises, the thermal shrinkage will arise almost equally on both sides of the interlayer connections 30 (vias) and the dummy vias 41 in the direction X.

For this reason, the thermal shrinkage is canceled, and it is possible to prevent the unnecessary deformation of the interlayer connections 30 (vias) and the dummy vias 41 during the heating process.

Moreover, the interlayer connections 30 (vias) and the dummy vias 41 are arranged and equally spaced as indicated by the arrows P in FIG. 19A, and the dummy vias 41 are provided at the ends of the arrangement of the vias 30 and/or at the locations where the arrangement of the vias 30 is sparse.

When the dummy vias 41a are arranged at the ends of the arrangement of the interlayer connections 30 (vias), the distance between the dummy via 41a and the outside edge of the second frame 29 in the direction Y may be set up arbitrarily.

The arrangement of the dummy vias 41a makes the stress on the end-position interlayer connections 30 (vias) be equivalent to the stress on the other inside-position interlayer connections 30 (vias), and it is possible to prevent the unnecessary deformation of the end-position interlayer connections 30 (vias) during the heating process.

Moreover, the arrangement of the dummy vias 41b where the arrangement of the interlayer connections 30 (vias) is sparse makes the stress on the sparse-position interlayer connections 30 (vias) be equivalent to the stress on the other interlayer connections 30 (vias), and it is possible to prevent the unnecessary deformation of the sparse-position interlayer connections 30 (vias) during the heating process.

Thus, in the second frame 29, not only the interlayer connections 30 (vias) but also the dummy vias 41 are arranged, and even if thermal shrinkage in the second frame 29 arises, it is possible to prevent the deformation of the interlayer connections 30 (vias) by the arrangement of the dummy vias 41. Thereby, the connection between the first reflow wiring 28 and the second reflow wiring 35 is established with high reliability.

Figure 20A:
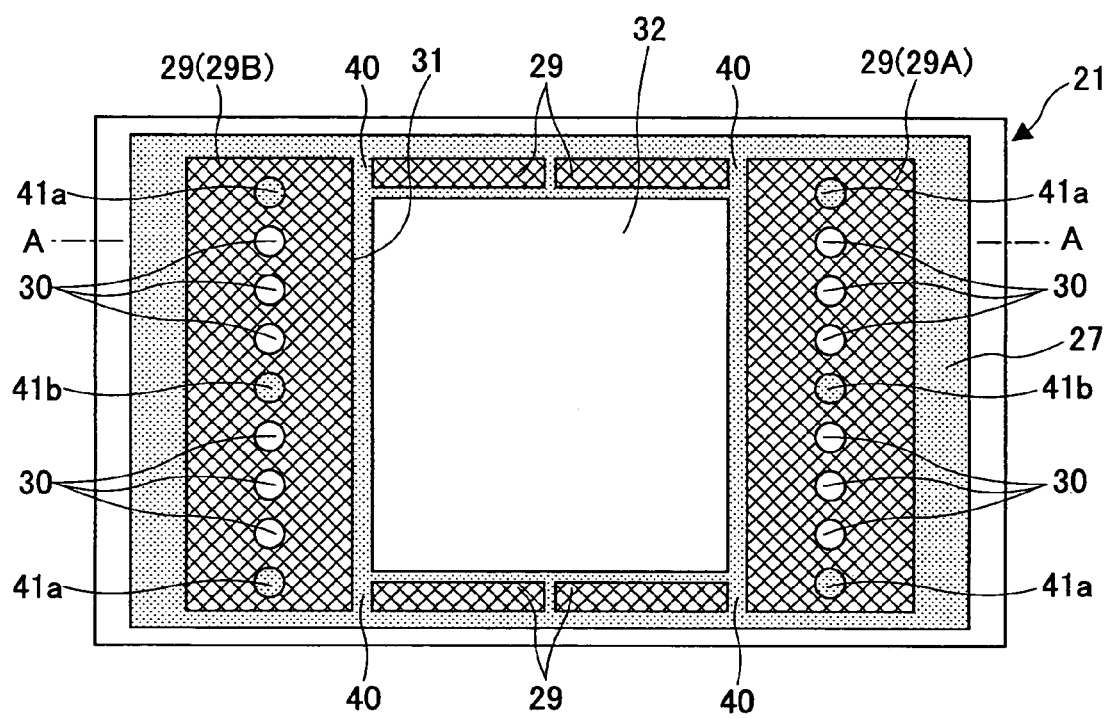
FIG. 20A and FIG. 20B are diagrams showing the processing to mount the second semiconductor chip in the method of manufacturing the semiconductor device in the preferred embodiment of the invention.
Figure 20B:
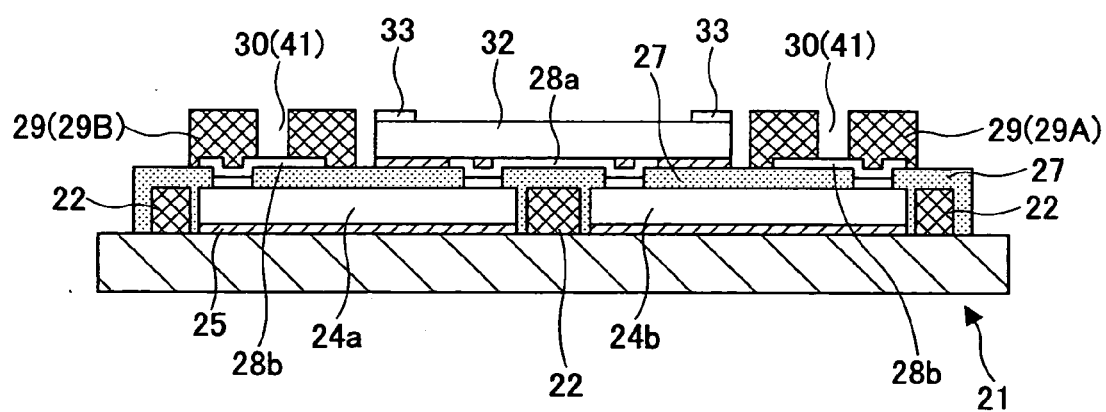

Subsequently, as shown in FIG. 20A and FIG. 20B, the second semiconductor chip 32 is held in the second component accommodating part 31. The second semiconductor chip 32 is bonded onto the first organic insulating layer 27 by the adhesive agent 25.

Figure 21A:
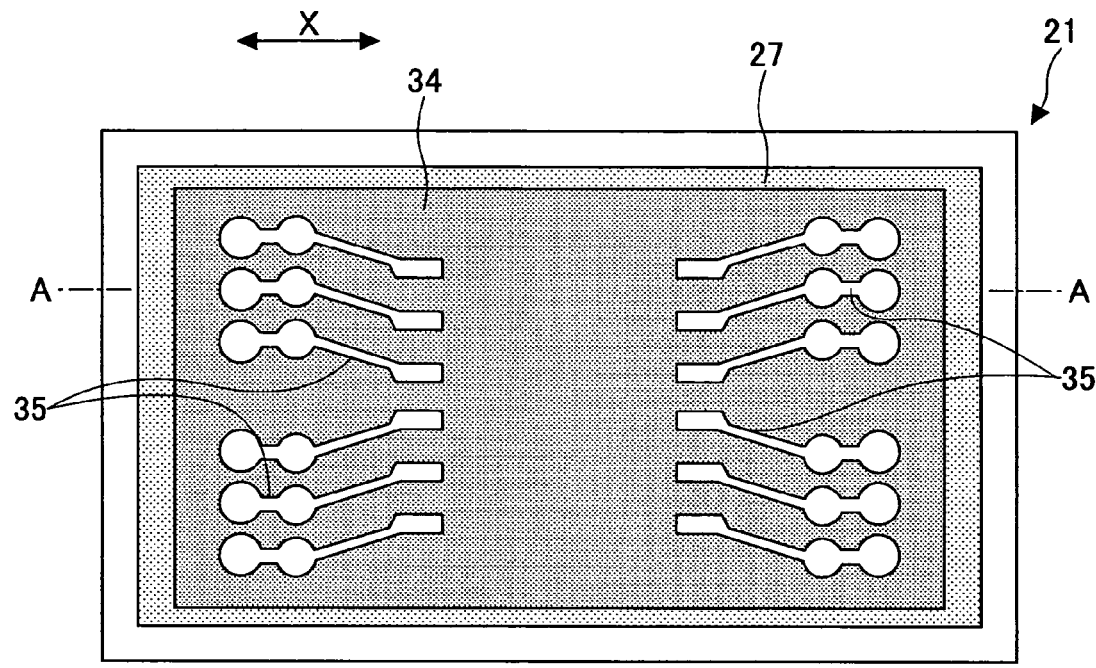
FIG. 21A and FIG. 21B are diagrams showing the processing to form the second organic insulating layer and the second reflow wiring in the method of manufacturing the semiconductor device in the preferred embodiment of the invention.
Figure 21B:
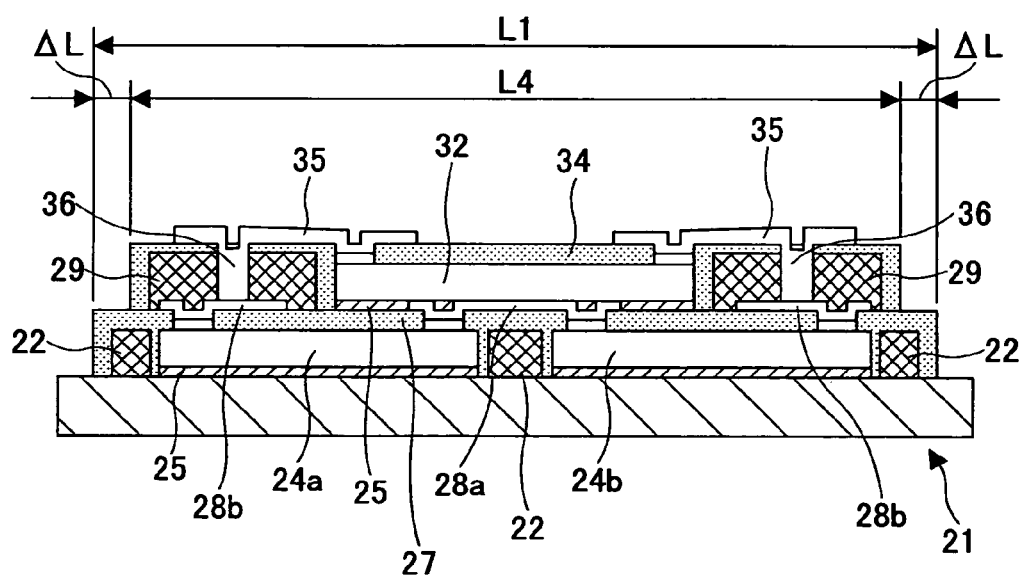

Subsequently, as shown in FIG. 21A and FIG. 21B, the second organic insulating layer 34 is formed to cover both the second frame 29 and the second semiconductor chip 32, and the second reflow wiring layer 35 is further formed on the second organic insulating layer 34.

At this time, the second organic insulating layer 34 is formed so that the second frame 29 is covered completely, and the gaps 40 which are arranged in the second frame 29 are also filled with the second organic insulating layer 34 to form the flat surface.

The patterning processing is performed through the photolithography process, and the applied organic insulating layer is left to encompass the entire surface of the second frame 29 including the outside circumferential sides thereof. Hence, the second organic insulating layer 34 is formed.

At this time, the patterning of the second organic insulating layer 34 is carried out to avoid encompassing the circumferential side surfaces of the first organic insulating layer 27. Moreover, at this time, the resin used as the second organic insulating layer 34 flows out to the outside through the gaps 40 of the second frame 29. For this reason, the air existing in the second component accommodating part 31 also flows out to the outside with the flow of the resin, and it is possible to prevent the occurrence of the voids between the second organic insulating layer 34 and the second frame 29.

Moreover, when forming the second organic insulating layer 34, the material of the second organic insulating layer 34 enters also the inside of the dummy vias 41 in the second frame 29 so that the dummy vias 41 are embedded in the second organic insulating layer 34.

In addition, before forming the second reflow wiring layer 35, the processing to form the metal layer 36 for interlayer connection is performed in the interlayer connections 30 (vias). To form the metal layer 36 for interlayer connection, the seed layer, such as copper (Cu), and the barrier layer, such as titanium (Ti), are beforehand formed on the internal surfaces of the interlayer connections 30 (vias) through the sputtering method, and then the electrolysis plating method is performed by using the seed layer as the electrode.

As described above, the positions where the interlayer connections 30 (vias) and the dummy vias 41 are formed in each of the frames 29A and 29B are set up to the central portion in the width direction of the second frame 29, and the dummy vias 41 are arranged at the ends of the interlayer connections 30 (vias). Thus, the deformation of the interlayer connections 30 (vias) can be prevented.

Therefore, it is possible to easily form the seed layer and the barrier layer with uniform thickness through the sputtering method. The arrangement of the barrier layer and the seed layer with uniform thickness allows the metal layer 36 for interlayer connection to be formed with high reliability.

The covering film 37 which is made of a polyimide resin is formed on the second organic insulating layer 34 after the second organic insulating layer 34 and the second reflow wiring layer 35 are formed. The covering film 37 is formed to provide the solder-resist characteristic.

Subsequently, a plurality of openings are formed at the positions of the covering film 37 where the external connection terminals 38 are arranged, and then the external connection terminals 38 which are made of the solder balls are arranged on the covering film 37 via the openings. See also FIG. 14A and FIG. 14B.

In the above-mentioned manufacture method, even if the second frame 29 is covered with the insulating layer, the maximum outside dimension of the second frame 29 is smaller than the maximum outside dimension of the first frame 22 covered with the insulating layer as shown in FIG. 21A, and the second frame 29 is arranged on the first frame 22.

Namely, as shown in FIG. 21B, the maximum outside dimension L1 of the first frame 22 covered with the first organic insulating layer 27 is larger than the maximum outside dimension L4 of the second frame 29 covered with the second organic insulating layer 34.

Therefore, around the periphery of the second organic insulating layer 34 which covers the second frame 29, the portion of the top surface of the first organic insulating layer 27 which covers the first frame 22 is exposed.

The width L of the exposed portion mentioned above in the direction X is about 50 micrometers, and the circumference of the second organic insulating layer 34 on the outside of the second frame 29 is surrounded by the exposed portion of the first organic insulating layer 27.

In this composition, when forming the second organic insulating layer 34 which covers the second frame 29, even if the thickness of the second organic insulating layer 34 is relatively large, the extension of the second organic insulating layer 34 to the outside of the first organic insulating layer 27 where the second organic insulating layer 34 covers the sides of the first frame 22 does not arise during the patterning, and no large variations of the outside dimension of the first organic insulating layer 27 will be caused.

According to the manufacture method of the semiconductor device in the preferred embodiment of the invention, the semiconductor substrates, such as silicone substrate, may be used as the substrate 21, and the known semiconductor manufacturing process can be applied. It is possible to attain the increase in efficiency of the production of the semiconductor device.

For example, when the semiconductor substrate is used as the substrate 21 and the frame is formed on the substrate 21, the photolithography process in the semiconductor manufacturing process can be applied.

FIG. 22A through FIG. 22D are diagrams for explaining the method of forming the first resin layer 22 (or the first frame) in this case.

Figure 22A:
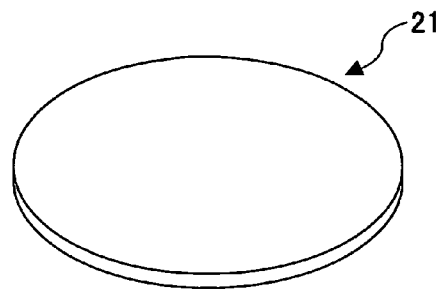
FIG. 22A, FIG. 22B, FIG. 22C and FIG. 22D are diagrams for explaining the formation of the first resin layer in the method of manufacturing the semiconductor device in the preferred embodiment of the invention.

As shown in FIG. 22A, the wafer 21, such as the silicone (Si) substrate, is prepared, and the photosensitive resin (photoresist) layer 42 is formed through the spin coat (rotation application) method on this wafer 21. The photosensitive resin layer 42 may be either of the positive type or of the negative type.

Figure 22B:
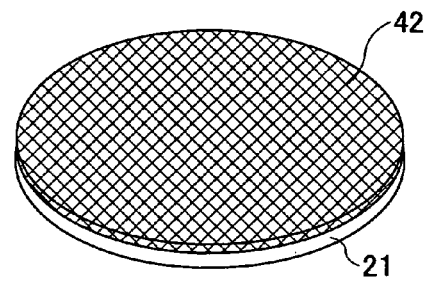

FIG. 22B shows the state where the photosensitive resin layer 42 is formed on the wafer 21.

Figure 22C:
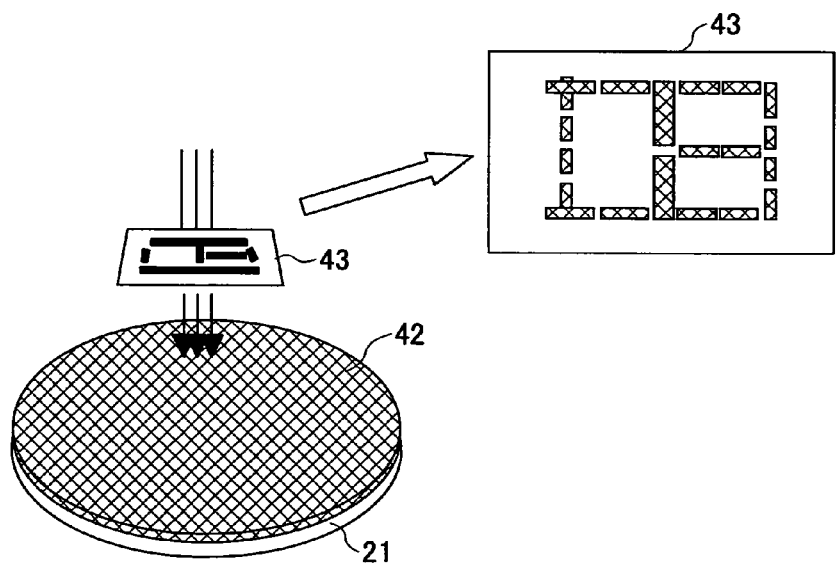

Subsequently, using the reticle 43 in which the division pattern corresponding to the configuration and arrangement of the first frame 22 is formed, as shown in FIG. 22C, the exposure processing is performed to the photosensitive resin layer 42.

Figure 22D:
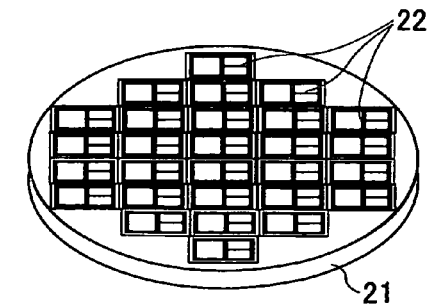

Subsequently, after the development processing is performed and the unnecessary part is removed, the heat treatment is carried out so that the photosensitive resin layer 42 is cured. Thereby, as shown in FIG. 22D, the plurality of the first frames 22 are formed on the wafer 21.

Similarly, the second frame 29 is also formed through the photolithography process which is the same as described above.

Accordingly, the formation of the frame can be carried out by applying the photolithography process in the semiconductor manufacturing process, and it is possible to form the frame with high accuracy.

On the other hand, when the substrate 21 on which the semiconductor devices are formed is cut into pieces so that each of the individual semiconductor devices 20 is formed, the dicing processing in the semiconductor manufacturing process can be applied.

Furthermore, in the semiconductor device of the present invention, at least the top surface and the side surface of the first frame 22 are covered with the first organic insulating layer 27, and the arrangement of the gaps 40 allows the occurrence of irregularity on the top surface of the first organic insulating-layer 27. This will be explained with reference to FIG. 23A and FIG. 23B.

Figure 23A:
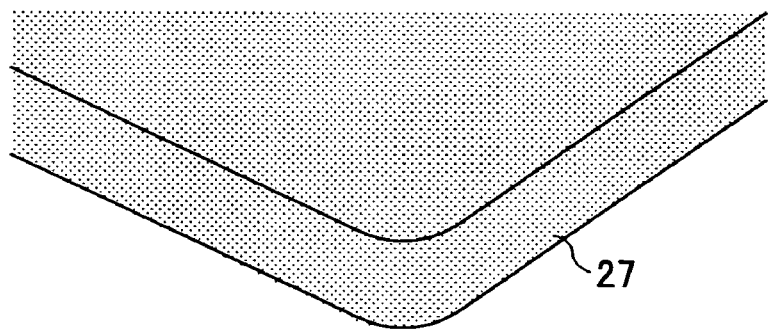
FIG. 23A and FIG. 23B are diagrams for explaining the effect of the formation of the first organic insulating layer so as to cover the first resin layer completely.
Figure 23B:
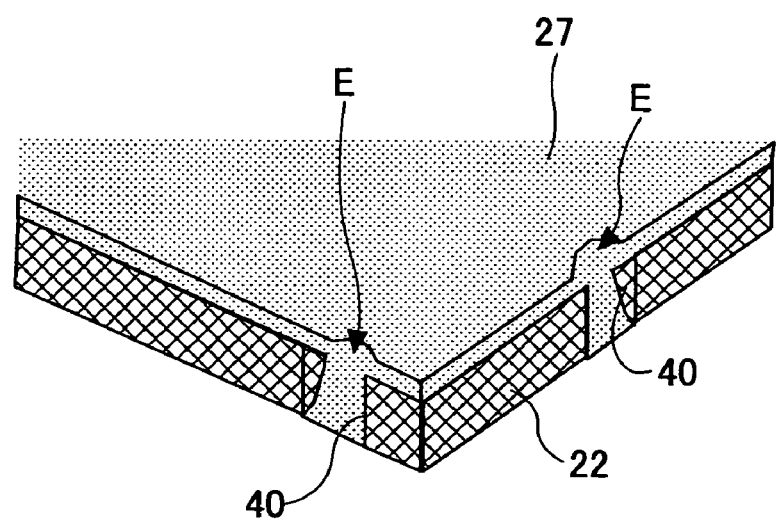

Assuming the state where the first organic insulating layer 27 is filled into the semiconductor-chip accommodating part which is formed by the first frame 22 which comprises the gaps 40, the resin which is applied to form the first organic insulating layer 27 will flow out to the outside through the gaps 40 as shown in FIG. 23B.

For this reason, the recess as indicated by the arrow E in FIG. 23B may be created in the gap 40 portion on the top surface of the first organic insulating layer 27.

Since the second frame 29 and the second semiconductor-chip 32 are laid on the top surface of the first organic insulating layer 27 as mentioned above, it is not desirable that irregularity exists on the top surface of the first organic insulating layer 27.

To avoid the problem, according to the present embodiment of the invention, as shown in FIG. 23A, the first organic insulating layer 27 is formed to cover the first frame 22 completely so that the gaps 40 are embedded completely. Hence, the top surface of the first organic insulating layer 27 is made into the flat surface.

As described above, the resin used as the first organic insulating layer 27 partially flows out to the outside through the gaps 40. At this time, the air existing between the first frame 22 and the first semiconductor chip 24 within the first component accommodating parts 23 is also pushed out to the outside with the resin. This prevents the occurrence of the voids in the first organic insulating layer 27, and it is therefore possible to prevent the occurrence of cracks or the separation due to the presence of the voids.

The resin used as the first organic insulating layer 27 is formed to cover the external side surfaces of the first frame 22. Such covering effect of the insulating layer to the frame is applicable also to the formation of the second organic insulating layer 34 on the second frame 29.

Next, some modifications of the semiconductor device 20 according to the present invention will be explained.

Figure 24A:
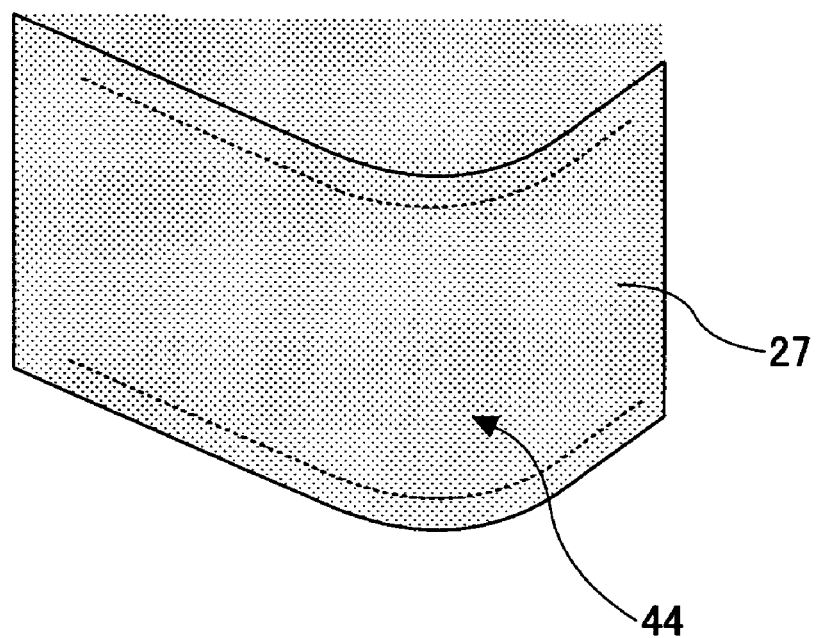
FIG. 24A and FIG. 24B are diagrams for explaining a first modification of the semiconductor device according to the invention.
Figure 24B:
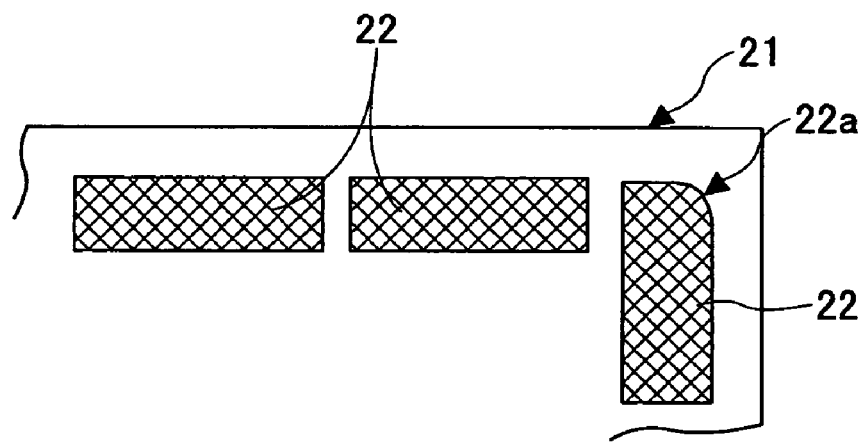

FIG. 24A and FIG. 24B show the first modification of the semiconductor device according to the invention. As shown, this semiconductor device is characterized by the configuration of the outside corner edges of the frame.

In this modification, as shown in FIG. 24B, the outside corner edges of the frame are configured to have the curvature (or the roundness R is added).

By making the outside corner edges of the frame into the curvature, the wettability (bonding characteristic) of the frame to the organic insulating layer can improve. Therefore, it is possible to prevent the outside corner edges of the frame from being exposed from the organic insulating layer. This composition is applicable to both the first frame 22 (shown in FIG. 24) and the second frame 29 (not shown).

Figure 25:
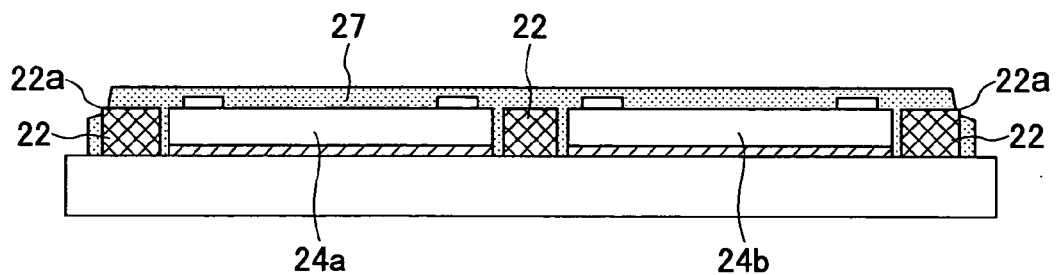
FIG. 25 is a diagram for explaining the problem arising in the corner edges of the semiconductor device.
Figure 26:
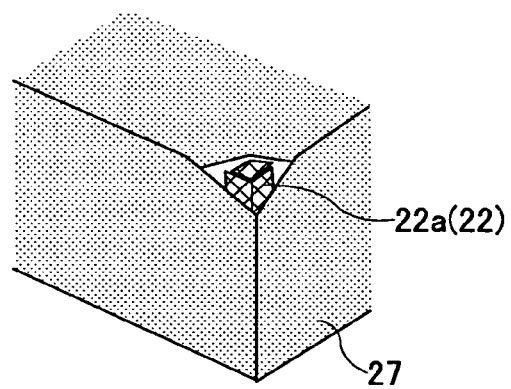
FIG. 26 is a diagram for explaining the problem arising in the corner edges of the semiconductor device.
Figure 27:
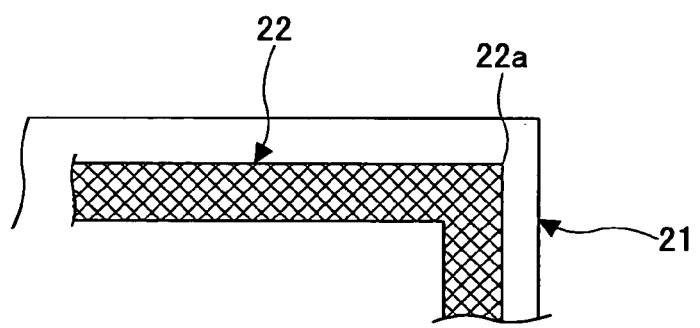
FIG. 27 is a diagram for explaining the problem arising in the corner edges of the semiconductor device.

On the other hand, there is the case where the wettability (bonding characteristic) becomes low in the corner edges of the organic insulating layer formed on the frame if the corner edges of the frame are steep as shown in FIG. 25. Moreover, if the organic insulating layer formed on the corner edges of the frame becomes thin as shown in FIG. 26, there is a possibility that the corner edges of the frame may be exposed from the organic insulating layer as shown in FIG. 27.

Next, the second modification of the semiconductor device according to the invention will be explained with reference to FIG. 28A and FIG. 28B.

Figure 28A:
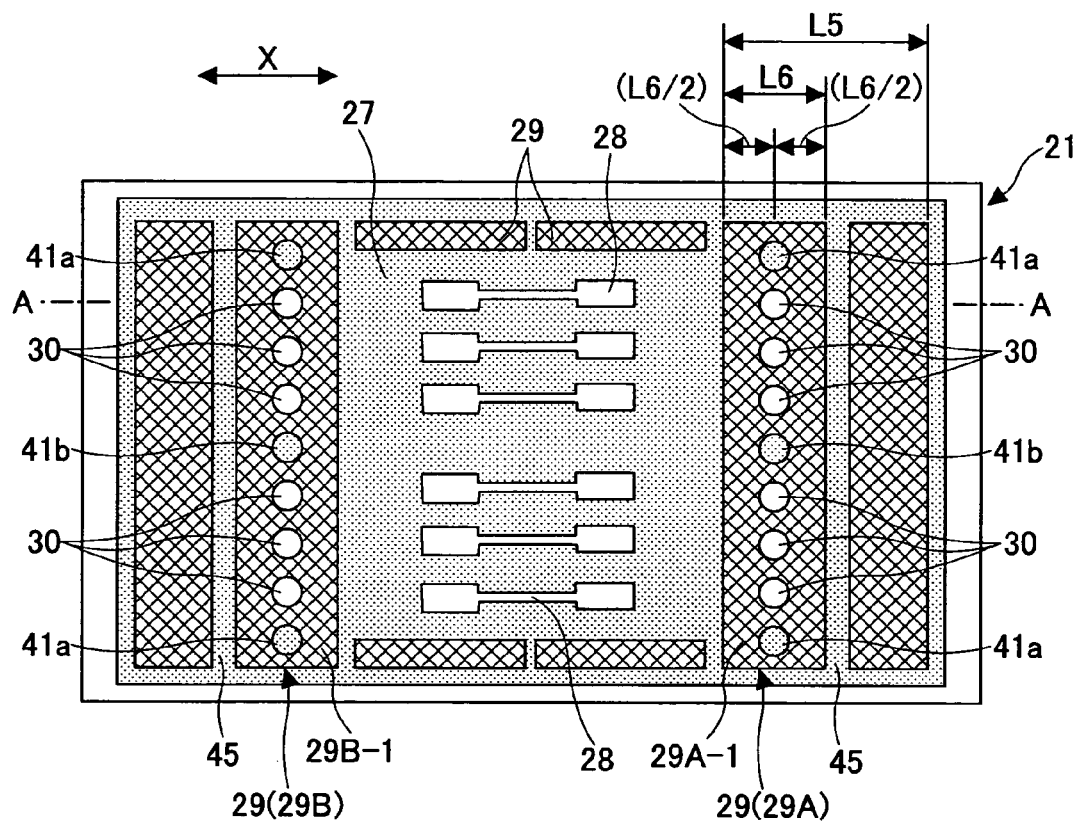
FIG. 28A and FIG. 28B are diagrams for explaining a second modification of the semiconductor device according to the invention.
Figure 28B:
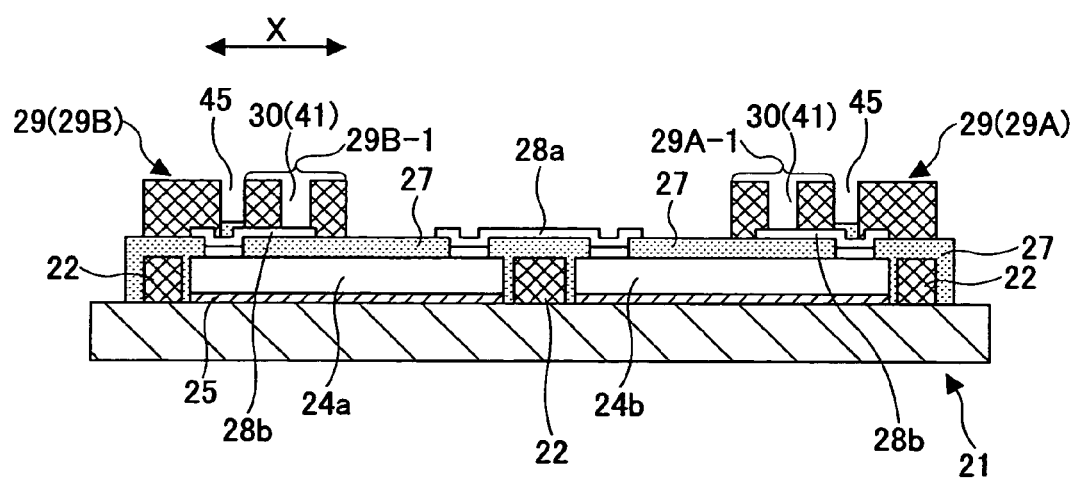

FIG. 28A is a plan view of the semiconductor device wherein the second frame 29 is formed on the first organic insulating layer 27, and FIG. 28B is a cross-sectional view of the semiconductor device taken along the line A-A indicated in FIG. 28A.

In this modification, in each of the second frame 29A and 29B is divided by the slit 45 so that the frame segments 29A-1, 29A-2, and the frame segments 29B-1, 29B-2 are arranged in the direction away from the semiconductor-chip accommodating part.

The interlayer connections 30 (vias) and the dummy vias 41 are arranged on the frame segments 29A-1 and 29B-1 on the side of the semiconductor-chip accommodating part among these divided frames 29A and 29B, so that they are located in the center (on the centerline) of the width L6 of each frame segment.

In the case where the semiconductor-chip accommodating part is comparatively small and the semiconductor chip held therein is comparatively small, the width L3 (FIG. 19A) of the frame becomes comparatively large. The arrangement of the interlayer connections 30 (vias) and the dummy vias 41 at the center portion (on the centerline) of each frame in such a case causes the distance between the electrodes of the semiconductor chip and the interlayer connections 30 (vias) to be increased. There is a possibility that the electrical characteristics of the semiconductor chip are degraded.

To avoid the problem, in this modification, the frame is divided into frame segments in the direction away from the semiconductor-chip accommodating part and the interlayer connections 30 (vias) are arranged on one of the frame segments nearest to the semiconductor chip. And the interlayer connections 30 (vias) are located at the center portion (on the centerline) of the frame segment. Hence, the deformation of the interlayer connections (vias) is prevented.

Using the above composition, the deformation of the interlayer connections 30 (vias) is prevented, and the degradation of the electrical characteristics of the semiconductor chip is thus prevented.

Figure 29:
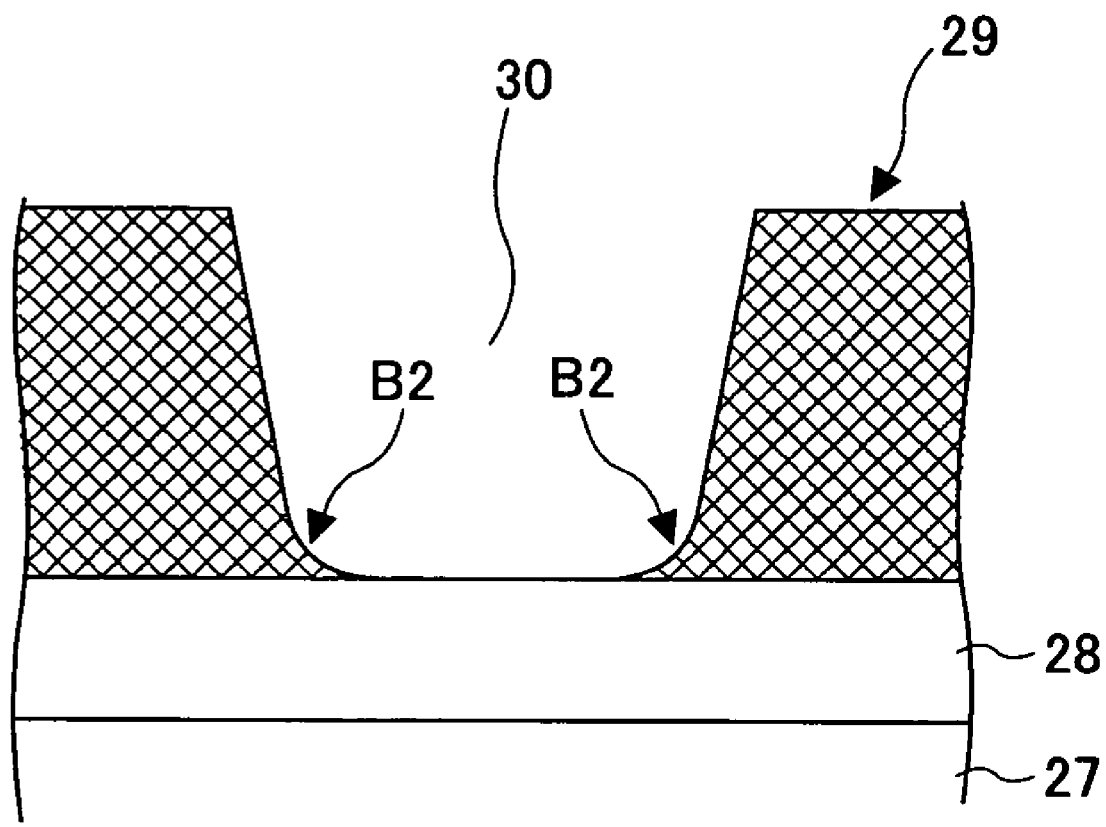
FIG. 29 is a diagram for explaining a third modification of the semiconductor device according to the invention.

Next, the third modification of the semiconductor device according to the invention will be explained with reference to FIG. 29.

In this modification, the bottom edges B2 of the inside wall of the interlayer connection 30 (via) in the second frame 29 are configured in a skirt-like formation. This configuration is attained by adjusting the exposure when forming the interlayer connections 30 (vias) through the exposure process shown in FIG. 22C.

The configuration of the bottom edges B2 of the inside wall of the interlayer connection 30 (via) into a skirt-like formation allows the barrier layer and the seed layer to be reliably formed on the inside wall of the interlayer connections 30 (vias) when forming these layers by the sputtering method.

Therefore, it is possible to form the vias 36 and the interlayer connections 30 with high reliability, and the reliability of the semiconductor device 20 is thus raised.

Figure 30A:
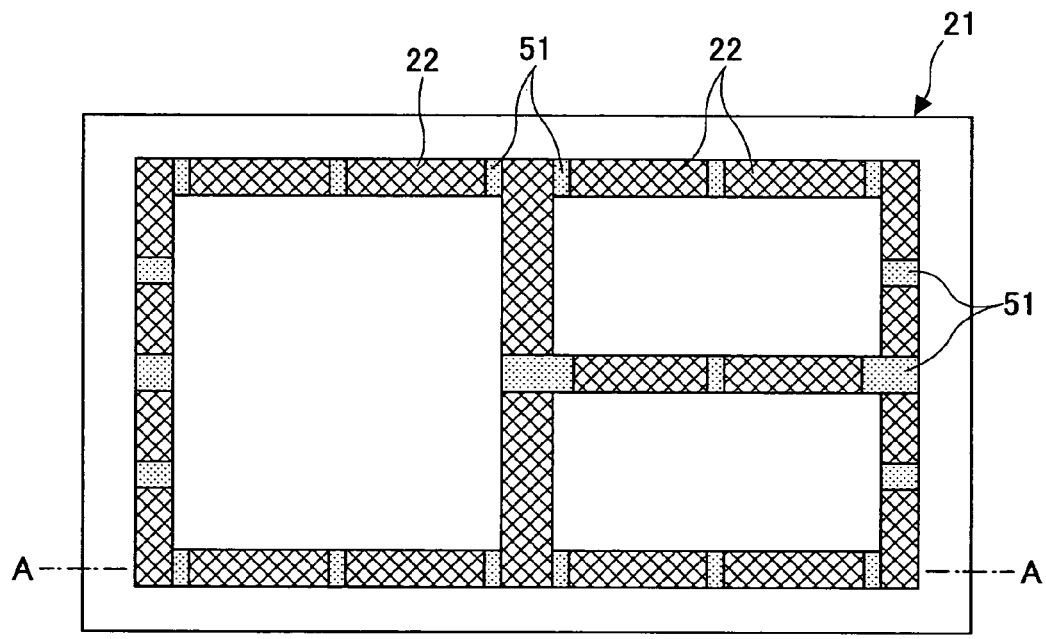
FIG. 30A, FIG. 30B and FIG. 30C are diagrams for explaining a fourth modification of the semiconductor device according to the invention.
Figure 30B:
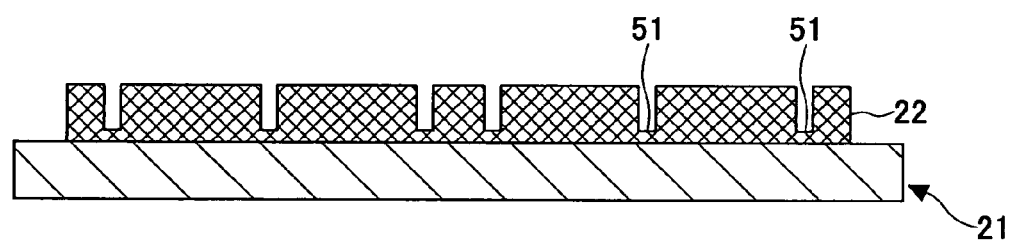
Figure 30C:
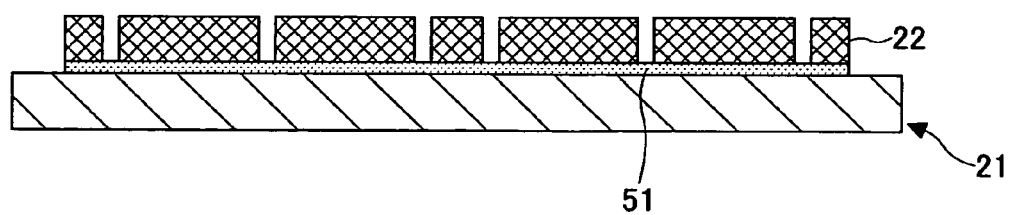

FIG. 30A, FIG. 30B and FIG. 30C show the semiconductor device in the fourth modification of the invention. FIG. 30B and FIG. 30C are cross-sectional views of the semiconductor device taken along the line A-A indicated in FIG. 30A.

In this modification, as shown in FIG. 30B, the arrangement of the first frame 22 is carried out such that the gaps 40 do not separate the frames 22 completely, but the thin layer 51 exists on the part of the substrate 21 corresponding to the gaps 40.

According to the above configuration, although the opening area of the gap 40 is reduced, the flow of the insulating material being applied or filled up is not restricted by choosing a suitable thickness (height) of the thin layer 51, thereby allowing discharging of the air and covering of the insulating layer over the frame.

The thin layer 51 may be formed prior to formation of the first frame 22. In such a case, as shown in FIG. 30C, it can be formed with the material which is the same as or different from the material of the frame. The arrangement of the thin layer 51 can be also applied when arranging the second frame 29.

Moreover, in the above-described embodiments, the composition wherein the two semiconductor chips are laminated in the two layers has been illustrated. However, it is the matter of course that the number of the semiconductor chips being laminated according to the present invention is not limited to the above embodiments.

Moreover, the silicone substrate is used as the substrate on which a plurality of semiconductor chips are laminated in the above-described embodiments. Alternatively, instead of the semiconductor substrate, the wiring substrate (or the interposer), which is made of an insulating material (such as, glass epoxy) and the surface or inside of which is formed with the conductive layer may be used according to the present invention. By using the wiring substrate (the interposer) in which the conductive layer is arranged on the surface of the insulating substrate, the two or more semiconductor chips may be laminated on the wiring substrate.

Moreover, the insulating substrate, made of the insulating material, such as glass and ceramics, may be also used instead of the semiconductor substrate, such as silicone (Si).

On the other hand, when using the semiconductor substrate, such as silicone (Si), the semiconductor substrate may be used to provide some function other than as the carrier substrate. Namely, the semiconductor chip and/or the electronic circuit using the semiconductor chip are formed, in advance, in the semiconductor substrate. After arranging the frame on the semiconductor substrate according to the present invention, the semiconductor chips may be laminated thereon, and the electric connection between the semiconductor chip (and/or the electronic circuit using the semiconductor chip) in the semiconductor substrate and the semiconductor chip laminated may be formed so that increased functions of the electronic circuit may be created.

Furthermore, the photosensitive resin has been used as the material of the frame in the above-described embodiments. Alternatively, any other, non-photosensitive resin may be also used as the material of the frame.

The present invention is not limited to the above-described embodiments, and variations and modifications may be made without departing from the scope of the present invention.

What is claimed is:

1. A semiconductor device comprising:
    a frame provided on a substrate to form a semiconductor-chip accommodating part on the substrate;
    a semiconductor chip provided in the semiconductor-chip accommodating part;
    an organic insulating layer provided to cover the semiconductor chip and the frame; and
    a wiring layer provided on the organic insulating layer, the frame comprising gaps which are arranged in a longitudinal direction of the frame.

2. The semiconductor device according to claim 1, wherein the gaps are arranged in the frame at least at corners of the semiconductor-chip accommodating part.

3. The semiconductor device according to claim 1 wherein the frame is made of a photosensitive resin material.

4. The semiconductor device according to claim 1 wherein openings are formed at a center portion in a width direction of the organic insulating layer.

5. The semiconductor device according to claim 1 wherein a plurality of openings are arranged sidewise in the organic insulating layer, and dummy vias are provided at ends of the plurality of openings.

6. The semiconductor device according to claim 1 wherein outside corners of the frame which are located at corners of the semiconductor-chip accommodating part are rounded.

7. A semiconductor device comprising:
    a first frame provided on a substrate to form a first semiconductor-chip accommodating part on the substrate;
    a first semiconductor chip provided in the first semiconductor-chip accommodating part;
    a first organic insulating layer provided to cover the first semiconductor chip and the first frame;
    a first wiring layer provided on the first organic insulating layer;
    a second frame provided on the first organic insulating layer and the first wiring layer to form a second semiconductor-chip accommodating part on the first organic insulating layer and the first wiring layer;
    a second semiconductor chip provided in the second semiconductor-chip accommodating part;
    a second organic insulating layer provided to cover the second semiconductor chip and the second frame; and
    a second wiring layer provided on the second organic insulating layer,
    each of the first frame and the second frame comprising gaps which are arranged in a longitudinal direction thereof, respectively.

8. The semiconductor device according to claim 7 wherein a maximum outside dimension of the second frame is smaller than a maximum outside dimension of the first frame.

9. The semiconductor device according to claim 7 wherein openings are formed at a center portion in a width direction of the second organic insulating layer.

10. The semiconductor device according to claim 7 wherein a plurality of openings are arranged sidewise in the second organic insulating layer, and dummy vias are provided at ends of the plurality of openings.

11. The semiconductor device according to claim 7 wherein outside corners of the first and second frames which are located at corners of the first and second semiconductor-chip accommodating parts are rounded respectively.

12. A method of manufacturing a semiconductor device, comprising the steps of:
    providing a frame on a substrate to form a semiconductor-chip accommodating part on the substrate, the frame comprising gaps which are arranged in a longitudinal direction of the frame;
    providing a semiconductor chip in the semiconductor-chip accommodating part which is formed by the frame;
    providing an organic insulating layer to cover the semiconductor chip and the frame; and
    providing a wiring layer on the organic insulating layer.

13. The method of manufacturing the semiconductor device according to claim 12 wherein, when the frame is provided on the substrate, the gaps are arranged in the frame at least at corners of the semiconductor-chip accommodating part.

* * * * *